(12) United States Patent
Kim et al.

(10) Patent No.: US 12,302,669 B2
(45) Date of Patent: May 13, 2025

(54) DISPLAY DEVICE HAVING BANK AND A LIGHT EMITTING ELEMENT IN AN OPENING

(71) Applicant: Samsung Display Co., Ltd., Yongin-si (KR)

(72) Inventors: Hoon Kim, Suwon-si (KR); Myeong Su So, Seoul (KR); Eun Je Jang, Hwaseong-si (KR); Jang Bog Ju, Seoul (KR); Joon Hoo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 767 days.

(21) Appl. No.: 17/347,147

(22) Filed: Jun. 14, 2021

(65) Prior Publication Data

US 2022/0069168 A1     Mar. 3, 2022

(30) Foreign Application Priority Data

Sep. 3, 2020   (KR) ........................ 10-2020-0112167

(51) Int. Cl.
| | |
|---|---|
| H01L 21/027 | (2006.01) |
| H01L 23/13 | (2006.01) |
| H01L 23/528 | (2006.01) |
| H01L 25/075 | (2006.01) |
| H01L 25/16 | (2023.01) |
| H10H 20/01 | (2025.01) |
| H10H 20/831 | (2025.01) |
| H10H 20/84 | (2025.01) |
| H10H 20/851 | (2025.01) |
| H10H 29/14 | (2025.01) |

(52) U.S. Cl.
CPC ............ *H10H 20/84* (2025.01); *H10H 20/01* (2025.01); *H10H 20/8312* (2025.01); *H10H 20/851* (2025.01); *H10H 29/142* (2025.01); *H10H 20/032* (2025.01); *H10H 20/034* (2025.01)

(58) Field of Classification Search
CPC ..... H01L 33/44; H01L 27/156; H01L 33/005; H01L 33/382; H01L 33/50; H01L 2933/0016; H01L 2933/0025; H01L 25/167; H01L 25/0753; H01L 33/62; H01L 2933/0066; H01L 21/0274; H01L 23/13; H01L 23/528; H01L 27/1214; H01L 33/505
See application file for complete search history.

(56) References Cited

U.S. PATENT DOCUMENTS

| | | |
|---|---|---|
| 9,401,389 B2 | 7/2016 | Cho |
| 10,825,951 B2 | 11/2020 | Lee et al. |

(Continued)

FOREIGN PATENT DOCUMENTS

| | | |
|---|---|---|
| CN | 110600513 A | 12/2019 |
| KR | 10-0943948 B1 | 2/2010 |

(Continued)

*Primary Examiner* — Herve-Louis Y Assouman
(74) *Attorney, Agent, or Firm* — Womble Bond Dickinson (US) LLP

(57) ABSTRACT

A display device includes: a substrate, a partition wall on the substrate and defining an opening, a first bank on the substrate and integrally formed with the partition wall, a first electrode on the partition wall and the first bank, and a light emitting element located in the opening and electrically connected to the first electrode.

17 Claims, 27 Drawing Sheets

(56) References Cited

U.S. PATENT DOCUMENTS

| | | | |
|---|---|---|---|
| 2014/0235001 A1 | 8/2014 | Chen et al. | |
| 2015/0236080 A1* | 8/2015 | Cho | H10K 50/86 |
| | | | 257/40 |
| 2016/0043161 A1* | 2/2016 | Miyazawa | H10K 59/122 |
| | | | 257/40 |
| 2019/0252576 A1* | 8/2019 | Lee | G09G 3/32 |
| 2020/0161280 A1* | 5/2020 | Heo | H01L 25/0753 |
| 2021/0066414 A1* | 3/2021 | Wang | H10K 59/126 |
| 2021/0151499 A1 | 5/2021 | Park et al. | |
| 2021/0313498 A1 | 10/2021 | Kim et al. | |

FOREIGN PATENT DOCUMENTS

| | | |
|---|---|---|
| KR | 20150096541 A | 8/2015 |
| KR | 20190098291 A | 8/2019 |
| KR | 10-2020-0005692 A | 1/2020 |
| KR | 10-2020-0034896 A | 4/2020 |
| KR | 10-2021-0059110 A | 5/2021 |
| KR | 10-2021-0124564 | 10/2021 |

\* cited by examiner

DISPLAY DEVICE HAVING BANK AND A LIGHT EMITTING ELEMENT IN AN OPENING

CROSS-REFERENCE TO RELATED APPLICATIONS

This application claims priority to and the benefit of Korean Patent Application No. 10-2020-0112167, filed on Sep. 3, 2020 in the Korean Intellectual Property Office (KIPO), the entire content of which is incorporated by reference herein.

BACKGROUND

1. Field

Aspects of embodiments of the present disclosure relate to a display device and a method for fabricating the same.

2. Description of the Related Arts

The importance of display devices has steadily increased with the development of multimedia technology. In response thereto, various types of display devices such as an organic light emitting diode (OLED) display, a liquid crystal display (LCD) and the like have been used.

A display device is a device for displaying an image, and includes a display panel, such as a light emitting display panel or a liquid crystal display panel. Among them, the light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

An inorganic light emitting diode using an inorganic semiconductor as a fluorescent material may be durable even in a high temperature environment, and has higher efficiency of blue light than an organic light emitting diode. Accordingly, continuous studies have been conducted on the inorganic light emitting diode having superior durability and efficiency compared to the organic light emitting diode.

SUMMARY

According to an aspect of some embodiments of the present disclosure, a display device capable of reducing a manufacturing cost by concurrently forming (e.g., simultaneously forming) a partition wall defining an opening where light emitting elements are arranged in sub-pixels and a bank serving as a dam that traps a coating solution containing the light emitting elements is provided.

According to an aspect of some embodiments of the present disclosure, a method for fabricating a display device capable of reducing a manufacturing cost by concurrently forming (e.g., simultaneously forming) a partition wall defining an opening where light emitting elements are arranged in sub-pixels and a bank serving as a dam that traps a coating solution containing the light emitting elements is provided.

However, embodiments of the present disclosure are not limited to those set forth herein. The above and other aspects of embodiments of the present disclosure will become more apparent to one of ordinary skill in the art to which the present disclosure pertains by referencing the detailed description of the present disclosure given below.

According to one or more embodiments of the present disclosure, a display device includes: a substrate, a partition wall on the substrate and defining an opening, a first bank on the substrate and integrally formed with the partition wall, a first electrode on the partition wall and the first bank, and a light emitting element located in the opening and electrically connected to the first electrode.

The partition wall and the first bank may include a same material.

A height of the partition wall may be lower than a height of the first bank.

The first electrode may be on a side surface of the first bank.

At least a portion of a side surface of the first bank may not be covered by the first electrode.

The first electrode may be on a top surface of the first bank.

The display device may further include a second electrode on the partition wall. The light emitting element may be electrically connected to the second electrode.

The second electrode may be on the first bank.

The second electrode is on a side surface and a top surface of the first bank.

The display device may further include: an insulating layer on the light emitting element, and a wavelength conversion layer on the insulating layer and configured to convert a wavelength of light emitted from the light emitting element.

The wavelength conversion layer is in contact with the first electrode on a side surface of the first bank.

The display device may further include: a second bank on a top surface of the first bank.

A height of the first bank is higher than a height of the second bank.

The wavelength conversion layer is in contact with a side surface of the second bank.

According to one or more embodiments of the present disclosure, a display device includes: a substrate, a bank on the substrate and defining an opening, a first electrode on the opening and the bank, a second electrode on the opening and the bank, and a light emitting element located in the opening and electrically connected to the first electrode and the second electrode. The bank includes a first sub-bank having a first height and a second sub-bank having a second height higher than the first height. The first sub-bank and the second sub-bank are integrally formed.

The first electrode may be on a side surface and a top surface of the first sub-bank, and a side surface of the second sub-bank.

The second electrode may be on a side surface and a top surface of the first sub-bank, and a side surface and a top surface of the second sub-bank.

According to one or more embodiments of the present disclosure, a method for fabricating a display device, includes: forming a photoresist layer on a substrate, exposing the photoresist layer using a halftone mask including a light blocking portion to block light, a first light transmitting portion to transmit light as it is, and a second light transmitting portion to transmit a part of the light, developing the photoresist layer to concurrently form an opening, a partition wall having a first height, and a bank having a second height, forming a first electrode and a second electrode on the opening, the partition wall, and the bank, the first electrode and the second electrode being spaced from each other; and applying a coating solution containing light emitting elements in the opening, forming an electric field between the first electrode and the second electrode to align the light emitting elements, and removing the coating solution.

The partition wall and the bank may be integrally formed.

The first electrode may be disposed on a side surface and a top surface of the partition wall, and a side surface of the bank.

According to the aforementioned and other embodiments of the present disclosure, a partition wall defining an opening and a bank serving as a dam that traps a coating solution containing light emitting elements in a process for forming the light emitting elements are integrally and concurrently formed (e.g., simultaneously formed) using a halftone mask. Accordingly, the cost of the mask can be reduced and, further, the manufacturing cost can be reduced.

BRIEF DESCRIPTION OF THE DRAWINGS

The above and other aspects and features of the present disclosure will become more apparent by describing some example embodiments thereof with reference to the attached drawings, in which.

DETAILED DESCRIPTION

Figure 1:
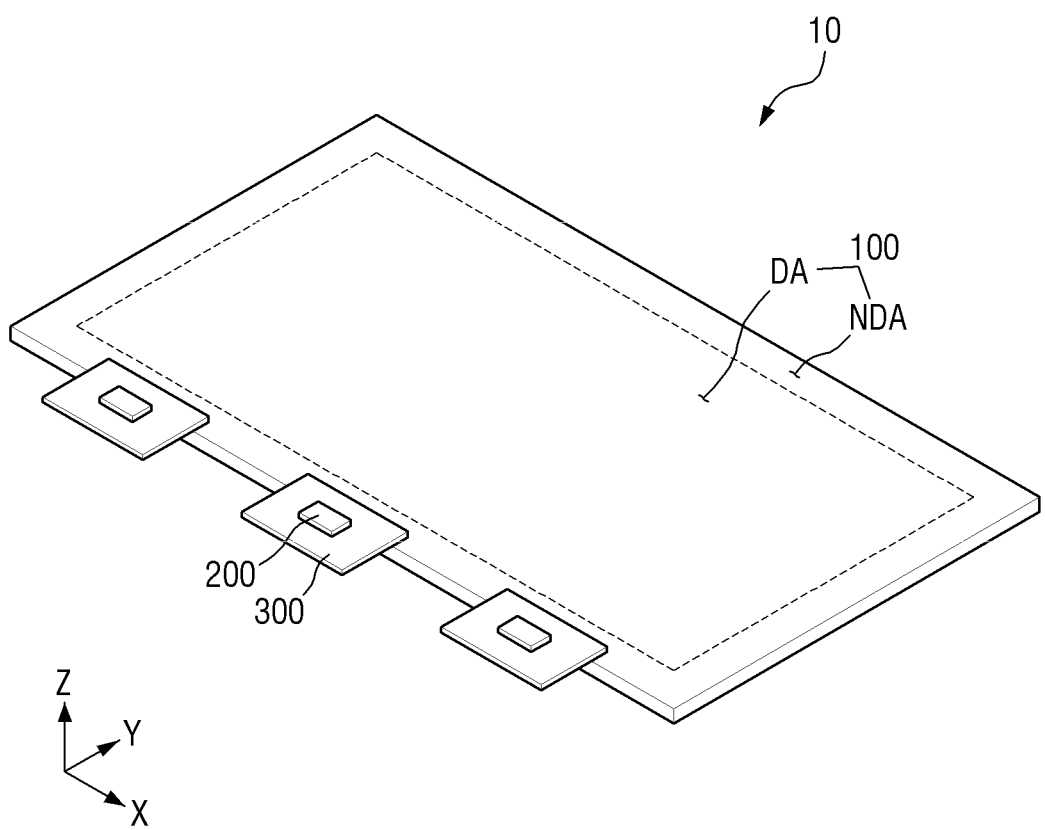
FIG. 1 is a perspective view illustrating a display device according to an embodiment.

The present disclosure will now be described more fully herein with reference to the accompanying drawings, in which some embodiments of the disclosure are shown. This disclosure may, however, be embodied in different forms and should not be construed as being limited to the embodiments set forth herein. Rather, these embodiments are provided so that this disclosure will be thorough and complete, and will fully convey the scope of the disclosure to those skilled in the art. The same reference numbers indicate the same or like components throughout the specification. In the attached figures, the thicknesses of layers and regions may be exaggerated for clarity.

Herein, the use of the term "may," when describing embodiments of the present disclosure, refers to "one or more embodiments of the present disclosure." As used herein, the term "and/or" includes any and all combinations of one or more of the associated listed items. As used herein, the singular forms "a," "an," and "the" are intended to include the plural forms as well, unless the context clearly indicates otherwise. As used herein, expressions such as "at least one of," "one of," and "selected from," when preceding a list of elements, modify the entire list of elements and do not modify the individual elements of the list.

It is to be understood that when an element or layer is referred to as being "on," "connected to," "coupled to," or "adjacent to" another element or layer, it may be directly on, connected to, coupled to, or adjacent to the other element or layer, or one or more intervening elements or layers may be present. In contrast, when an element or layer is referred to as being "directly on," "directly connected to," "directly coupled to," or "immediately adjacent to" another element or layer, there are no intervening elements or layers present. As used herein, the terms "substantially," "about," and similar terms are used as terms of approximation and not as terms of degree, and are intended to account for the inherent deviations in measured or calculated values that would be recognized by those of ordinary skill in the art.

As used herein, phrases such as "a plan view" may refer to a view from top or from a direction normal to the display area of the display device.

Spatially relative terms, such as "beneath," "below," "lower," "above," "upper," "bottom," "top," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (e.g., rotated 90 degrees or at other orientations), and the spatially relative descriptors used herein should be interpreted accordingly.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which the present disclosure belongs. It is to be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

Herein, some example embodiments of the present disclosure will be described with reference to the attached drawings.

FIG. 1 is a perspective view illustrating a display device according to an embodiment.

Referring to FIG. 1, a display device 10 is a device for displaying a moving image or a still image. The display device 10 may be used as a display screen of various devices, such as a television, a laptop computer, a monitor, a billboard, and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

In the present disclosure, an inorganic light emitting display device including an inorganic semiconductor element as a light emitting element is illustrated as an example of the display device 10 according to an embodiment. However, the present disclosure is not limited thereto.

The display device 10 according to an embodiment includes a display panel 100, display driving circuits 200, and circuit boards 300.

The display panel 100 may be formed in a rectangular shape, in plan view, having long sides in a first direction (X-axis direction) and short sides in a second direction (Y-axis direction) crossing the first direction (X-axis direction). The corner where the long sides in the first direction (X-axis direction) and the short sides in the second direction (Y-axis direction) meet may be rounded to have a curvature (e.g., a set or predetermined curvature) or may be right-angled. The planar shape of the display panel 100 is not limited to the rectangular shape, and may be formed in another polygonal shape, a circular shape or an elliptical shape. The display panel 100 may be formed to be flat, but is not limited thereto. For example, the display panel 100 may include a curved portion having a curvature (e.g., a set or predetermined curvature) or a varying curvature. Alternatively, the display panel 100 may be formed flexibly such that it can be curved, bent, folded, or rolled.

The display panel 100 may include a display area DA displaying an image and a non-display area NDA disposed around the display area DA along the edge or periphery of the display area DA. Alternatively, a substrate SUB (see FIG. 4) of the display panel 100 may include the display area DA and the non-display area NDA.

The display area DA may occupy most of the area of the display panel 100. The display area DA may be disposed at the center (or central region) of the display panel 100. Pixels PX (see FIG. 2) may be arranged in the display area DA to display an image.

The non-display area NDA may be disposed adjacent to the display area DA. The non-display area NDA may be an area outside the display area DA. The non-display area NDA may be disposed to surround the display area DA along the edge or periphery of the display area DA. The non-display area NDA may be an edge area of the display area DA.

Display pads may be arranged in the non-display area NDA to be connected to the circuit boards 300. The display pads may be disposed on one side edge of the display panel 100. For example, the display pads may be disposed at the lower edge of the display panel 100.

The circuit boards 300 may be disposed on the display pads disposed on one side edge of the display panel 100. The circuit boards 300 may be attached to the display pads using a low-resistance, high-reliability material such as an anisotropic conductive film, a self-assembly anisotropic conductive paste (SAP) or the like. Accordingly, the circuit boards 300 may be electrically connected to the signal lines of the display panel 100. The display panel 100 may receive data voltages, source voltages, scan timing signals, and the like through the circuit boards 300. The circuit boards 300 may each be a flexible printed circuit board, a printed circuit board, or a flexible film such as a chip on film.

The display driving circuits 200 may generate the data voltages, the source voltages, the scan timing signals, and the like. The display driving circuits 200 may supply the data voltages, the source voltages, the scan timing signals, and the like to the display panel 100 through the circuit boards 300.

Each of the display driving circuits 200 may be formed of an integrated circuit (IC) and attached to the circuit board 300. Alternatively, the display driving circuits 200 may be attached onto the display panel 100 by a chip on glass (COG) method, a chip on plastic (COP) method, or an ultrasonic bonding method.

Figure 2:
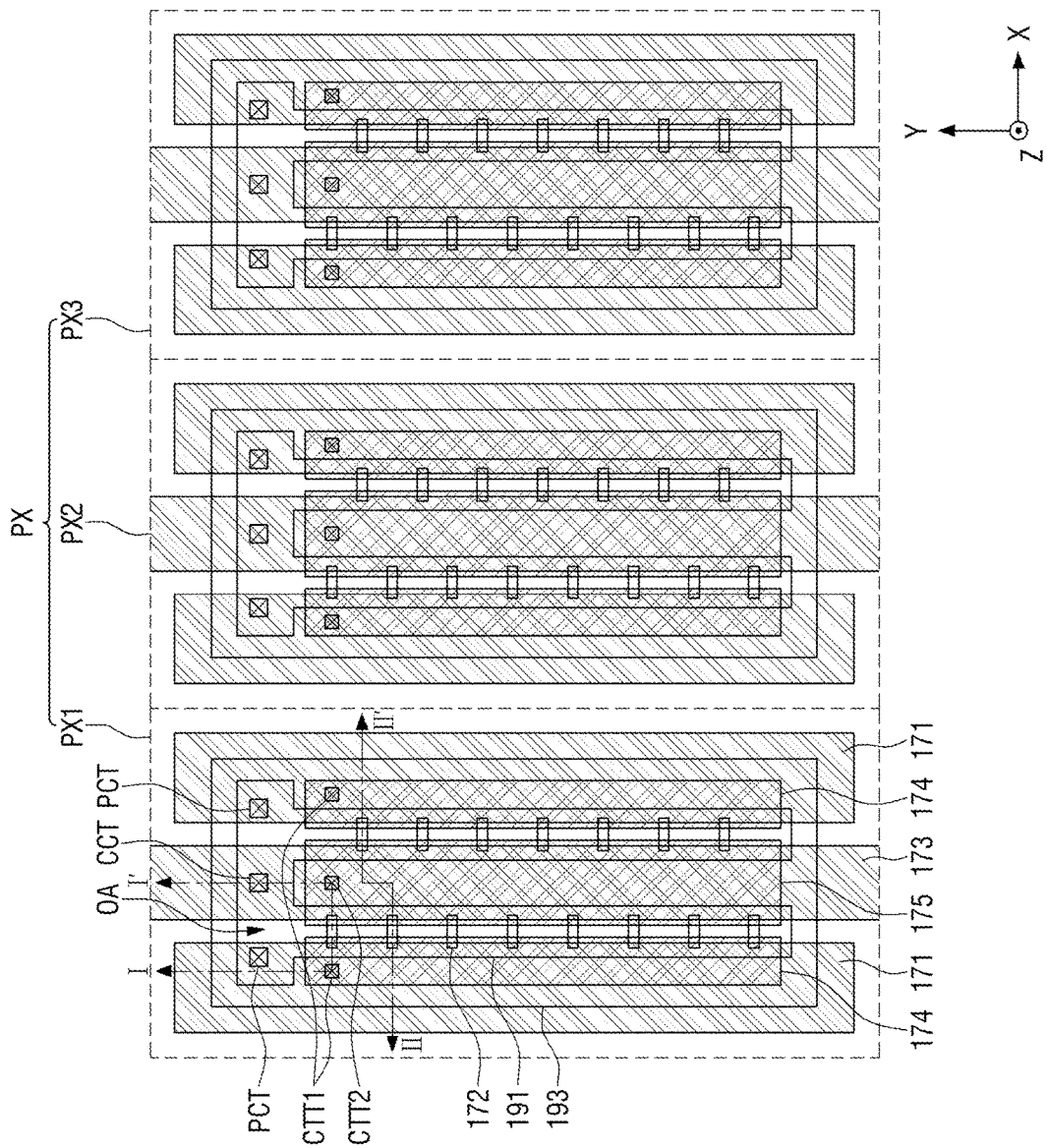
FIG. 2 is a plan view illustrating an example of a pixel in a display area of a display panel of FIG. 1.

FIG. 2 is a plan view illustrating an example of a pixel in a display area of a display panel of FIG. 1.

Referring to FIG. 2, the display area DA includes the pixels PX arranged along the first direction (X-axis direction) and the second direction (Y-axis direction). In FIG. 2, only one pixel PX is illustrated for simplicity of description.

Each of the pixels PX includes a plurality of sub-pixels PX1, PX2, and PX3. In the present disclosure, it is illustrated that each of the pixels PX includes three sub-pixels, i.e., a first sub-pixel PX1, a second sub-pixel PX2, and a third sub-pixel PX3. However, the present disclosure is not limited thereto, and for example, each pixel may include four or more sub-pixels in other embodiments.

The first sub-pixel PX1 may include light emitting elements 172 that emit a first color light, the second sub-pixel PX2 may include light emitting elements 172 that emit a second color light, and the third sub-pixel PX3 may include light emitting elements 172 that emit a third color light. The first color light may be red light having a central wavelength band of 600 nm to 750 nm, the second color light may be green light having a central wavelength band of 480 nm to 560 nm, and the third color light may be blue light having a central wavelength band of 370 nm to 490 nm.

In a first display area DA1, the first sub-pixels PX1, the second sub-pixels PX2, and the third sub-pixels PX3 may be alternately arranged along the first direction (X-axis direction). The first sub-pixels PX1 may be arranged along the second direction (Y-axis direction), the second sub-pixels PX2 may be arranged along the second direction (Y-axis direction), and the third sub-pixels PX3 may be arranged along the second direction (Y-axis direction).

Each of the first sub-pixels PX1, the second sub-pixels PX2, and the third sub-pixels PX3 may include a first electrode 171, a second electrode 173, a first contact electrode 174, a second contact electrode 175, and light emitting elements 172.

The first electrode 171 may be a pixel electrode disposed separately for each of the sub-pixels PX1, PX2, and PX3, and the second electrode 173 may be a common electrode commonly connected to a plurality of sub-pixels. For example, the second electrode 173 of any one sub-pixel may be electrically connected to the second electrode 173 of the sub-pixel adjacent thereto in the second direction (Y-axis direction). The first electrode 171 may be an anode electrode electrically connected to one end of the light emitting element 172, and the second electrode 173 may be a cathode electrode electrically connected to the other end of the light emitting element 172. In some embodiments, the second electrode 173 may be a common electrode commonly connected to the sub-pixels PX1, PX2, and PX3 also.

The first electrode 171 and the second electrode 173 may extend in the second direction (Y-axis direction). One of the first electrodes 171 in a sub-pixel may be located on one side of the second electrode 173 of that sub-pixel, and the other one of the first electrode 171 may be located on the other side of the second electrode 173 of that sub-pixel. The first electrode 171 and the second electrode 173 may be spaced from each other and may be electrically separated from each other.

The first electrode 171 may be electrically connected to a source electrode or a drain electrode of a thin film transistor ST (see FIGS. 4 and 5) through a pixel contact hole PCT. The second electrode 173 may be electrically connected to a first power supply line VL1 (see FIGS. 4 and 5) through a common contact hole CCT.

FIG. 2 illustrates that each of the sub-pixels PX1, PX2, and PX3 includes two first electrodes 171 and one second electrode 173, but the present disclosure is not limited thereto. Each of the sub-pixels PX1, PX2, and PX3 may include one first electrode 171 and one second electrode 173, or may include three or more first electrodes 171 and two or more second electrodes 173. Further, the first electrode 171 and the second electrode 173 may have a partially curved or bent shape, and any one of the first electrode 171 and the second electrode 173 may be disposed to surround (or to be around) the other electrode. In other words, the first electrode 171 and the second electrode 173 may have various arrangement structures or shapes as long as at least a portion of the first electrode 171 and at least a portion of the second electrode 173 face each other (i.e., opposite each other) while being spaced from each other and an area where the light emitting elements 172 are arranged is formed between the first electrode 171 and the second electrode 173.

The first contact electrode 174 and the second contact electrode 175 may extend in the second direction (Y-axis direction). Each of the extension length (length in the second direction (Y-axis direction)) of the first contact electrode 174 and the extension length (length in the second direction (Y-axis direction)) of the second contact electrode 175 may be shorter than the extension length (length in the second direction (Y-axis direction)) of the first electrode 171. Each of the width (length in the first direction (X-axis direction)) of the first contact electrode 174 and the width (length in the first direction (X-axis direction)) of the second contact electrode 175 may be shorter than the width (length in the first direction (X-axis direction)) of the first electrode 171.

The first contact electrode 174 may overlap the first electrode 171 in the third direction (Z-axis direction). The first contact electrode 174 may be connected to the first electrode 171 through a first contact hole CTT1.

The second contact electrode 175 may overlap the second electrode 173 in the third direction (Z-axis direction). The second contact electrode 175 may be connected to the second electrode 173 through a second contact hole CTT2.

The first contact electrode 174 may be in contact with the first electrode 171 disposed at one end of the light emitting element 172. The second contact electrode 175 may be in contact with the second electrode 173 disposed at the other end of the light emitting element 172. Accordingly, the light emitting element 172 may be electrically connected to the first electrode 171 through the first contact electrode 174, and may be electrically connected to the second electrode 173 through the second contact electrode 175.

The light emitting elements 172 may be spaced from each other. The light emitting elements 172 may be arranged along the second direction (Y-axis direction). The light emitting elements 172 may extend in the first direction (X-axis direction).

The light emitting elements 172 may be arranged in the opening OA defined by a partition wall 191. In other words, the light emitting elements 172 may not overlap the partition wall 191 in the third direction (Z-axis direction).

One ends of the light emitting elements 172 may be in contact with a first contact electrode 174, and the other ends of the light emitting elements 172 may be in contact with a second contact electrode 175. One ends of the light emitting elements 172 may overlap the first electrode 171 in the third direction (Z-axis direction), and the other ends of the light emitting elements 172 may overlap the second electrode 173 in the third direction (Z-axis direction).

Each of the light emitting elements 172 may have a shape of a rod, a wire, a tube, or the like. For example, each of the light emitting elements 172 may be formed in a cylindrical shape or a rod shape. Alternatively, each of the light emitting elements 172 may have a polyhedral shape such as a regular cube and a rectangular parallelepiped, or a polygonal prism shape such as a hexagonal prism or the like. Alternatively, each of the light emitting elements 172 may have a shape extending in one direction and having a partially inclined outer surface, such as a truncated cone. Each of the light emitting elements 172 may have a length of 1 μm to 10 μm or 2 μm to 6 μm, and in some embodiments, 3 μm to 5 μm. Further, each of the light emitting elements 172 may have a diameter of 300 nm to 700 nm and an aspect ratio of 1.2 to 100.

The partition wall 191 may define the opening OA where the light emitting elements 172, the pixel contact hole PCT, and the common contact hole CCT are arranged. FIG. 2 illustrates that one opening OA is formed by connecting the opening OA where the light emitting elements 172 are disposed to the opening OA where the pixel contact hole PCT and the common contact hole CCT are disposed. However, the embodiments of the present disclosure are not limited thereto. The opening OA where the light emitting elements 172 are disposed and the opening OA where the pixel contact hole PCT and the common contact hole CCT are disposed may be separated by the partition walls 191.

A first bank 193 may be disposed outside the partition wall 191. The first bank 193 may surround (e.g., be around or on both sides of) the partition wall 191. The first bank 193 may serve as a dam that traps a coating solution containing the light emitting elements 172 in the process of aligning the light emitting elements 172. The first bank 193 may be disposed at the peripheral portion of each of the sub-pixels PX1, PX2, and PX3.

Figure 3:
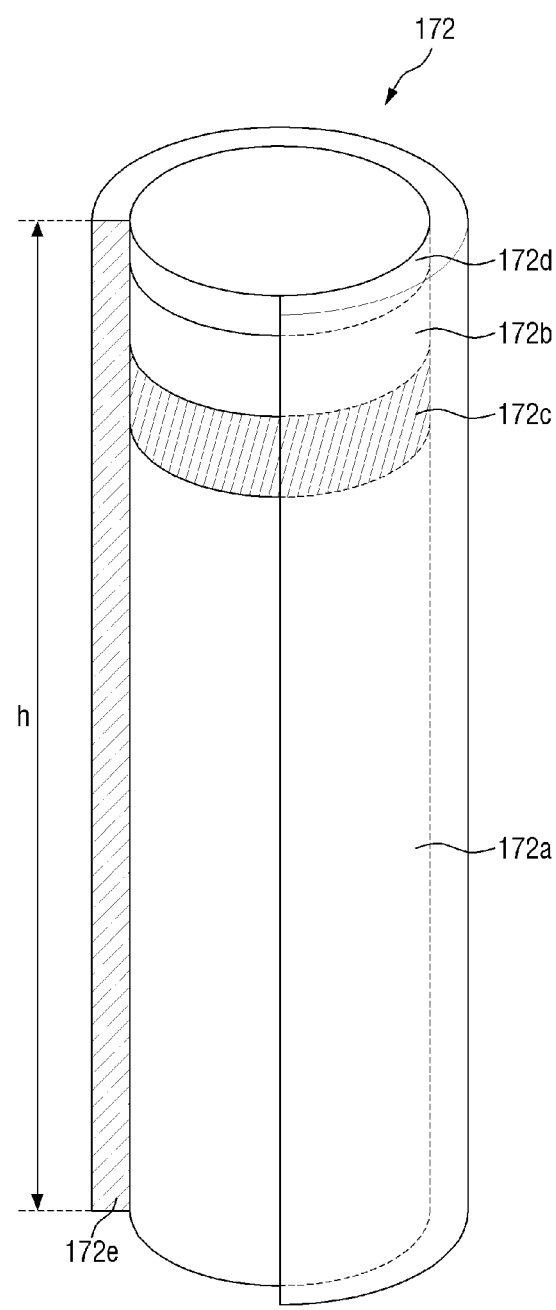
FIG. 3 is a schematic cutaway view showing a light emitting element of FIG. 2.

FIG. 3 is a schematic cutaway view showing a light emitting element according to an embodiment.

Referring to FIG. 3, the light emitting element 172 may include a first semiconductor layer 172a, a second semiconductor layer 172b, an active layer 172c, an electrode layer 172d, and an insulating layer 172e.

The light emitting element 172 according to an embodiment may have a shape extending in one direction. The light emitting element 172 may have a shape of a rod, wire, tube, or the like. In an embodiment, the light emitting element 172 may have a cylindrical or rod shape. However, the shape of the light emitting element 172 is not limited thereto, and the light emitting element 172 may have a polygonal prism shape such as a regular cube, a rectangular parallelepiped and a hexagonal prism, or may have various shapes such as a shape extending in one direction and having an outer surface partially inclined.

The light emitting element 172 may include a semiconductor layer doped with any conductivity type (e.g., p-type or n-type) impurities. The semiconductor layer may emit light of a specific wavelength band by receiving an electrical signal applied from an external power source. A plurality of semiconductors included in the light emitting element 172 may have a structure in which they are sequentially arranged or stacked along the one direction.

The light emitting element 172 may include the first semiconductor layer 172a, the second semiconductor layer 172b, the active layer 172c, the electrode layer 172d, and the insulating layer 172e. FIG. 3 illustrates a state in which the first semiconductor layer 172a, the second semiconductor layer 172b, the active layer 172c, and the electrode layer 172d are exposed by removing a portion of the insulating layer 172e to show the respective components of the light emitting element 172. The insulating layer 172e may be disposed to surround the outer surfaces (e.g., outer peripheral surfaces) of the first semiconductor layer 172a, the second semiconductor layer 172b, the active layer 172c, and the electrode layer 172d.

The first semiconductor layer 172a may be an n-type semiconductor. For example, when the light emitting element 172 emits light of a blue wavelength band, the first semiconductor layer 172a may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of n-type doped AlGaInN, GaN, AlGaN, InGaN, AlN, and InN. The first semiconductor layer 172a may be doped with an n-type dopant. For example, the n-type dopant may be Si, Ge, Sn, or the like. In an embodiment, the first semiconductor layer 172a may be n-GaN doped with n-type Si. The length of the first semiconductor layer 172a may have a range of 1.5 μm to 5 μm, but is not limited thereto.

The second semiconductor layer 172b is disposed on the active layer 172c to be described later. The second semiconductor layer 172b may be a p-type semiconductor. For example, when the light emitting element 172 emits light of a blue or green wavelength band, the second semiconductor layer 172b may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of p-type doped AlGaInN, GaN, AlGaN, InGaN, AlN, and InN. The second semiconductor layer 172b may be doped with a p-type dopant. For example, the p-type dopant may be Mg, Zn, Ca, Se, Ba, or the like. In an embodiment, the second semiconductor layer 172b may be p-GaN doped with p-type Mg. The length of the second semiconductor layer 172b may have a range of 0.05 μm to 0.10 μm, but is not limited thereto.

Although FIG. 3 illustrates that the first semiconductor layer 172a and the second semiconductor layer 172b are formed as one layer, the embodiments of the present disclosure are not limited thereto. For example, the first semiconductor layer 172a and the second semiconductor layer 172b may include a larger number of layers (e.g., a cladding layer or a tensile strain barrier reducing (TSBR) layer) depending on the material of the active layer 172c.

The active layer 172c is disposed between the first semiconductor layer 172a and the second semiconductor layer 172b. The active layer 172c may include a material having a single or multiple quantum well structure. When the active layer 172c includes a material having a multiple quantum well structure, a plurality of quantum layers and well layers may be stacked alternately. The active layer 172c may emit light by coupling of electron-hole pairs according to an electrical signal applied through the first semiconductor layer 172a and the second semiconductor layer 172b. For example, when the active layer 172c emits light of a blue wavelength band, a material such as AlGaN or AlGaInN may be included. For example, when the active layer 172c has a structure in which quantum layers and well layers are alternately stacked in a multiple quantum well structure, the quantum layer may include a material such as AlGaN or AlGaInN, and the well layer may include a material such as GaN or AlInN. In an embodiment, the active layer 172c may include AlGaInN as a quantum layer and AlInN as a well layer, and the active layer 172c may emit blue light having a central wavelength band of 370 nm to 490 nm.

However, the present disclosure is not limited thereto, and the active layer 172c may have a structure in which semiconductor materials having large band gap energy and semiconductor materials having small band gap energy are alternately stacked, and may include other Group III to V semiconductor materials according to the wavelength band of the emitted light. The light emitted by the active layer 172c is not limited to light of a blue wavelength band, and may be light of a red wavelength band or light of a green wavelength band. The length of the active layer 172c may have a range of 0.05 μm to 0.10 μm, but is not limited thereto.

In some embodiments, light emitted from the active layer 172c may be emitted to both side surfaces as well as the outer surface of the light emitting element 172 in a length direction. The directionality of the light emitted from the active layer 172c is not limited to one direction.

The electrode layer 172d may be an Ohmic contact electrode. However, the electrode layer 172d is not limited thereto, and may be a Schottky contact electrode. The light emitting element 172 may include at least one electrode layer 172d. FIG. 3 illustrates that the light emitting element 172 includes one electrode layer 172d. However, the light emitting element 172 may include two or more electrode layers 172d. Alternatively, the electrode layer 172d of the light emitting element 172 may be omitted.

The electrode layer 172d may reduce the resistance between the light emitting element 172 and the first contact electrode 174 when one end of the light emitting element 172 is in contact with the first contact electrode 174. The electrode layer 172d may contain a conductive metal. For example, the electrode layer 172d may include at least one of aluminum (Al), titanium (Ti), indium (In), gold (Au), silver (Ag), indium tin oxide (ITO), indium zinc oxide (IZO), or indium tin zinc oxide (ITZO). Further, the electrode layer 172d may include an n-type or p-type doped semiconductor material. The length of the electrode layer 172d may have a range of 0.05 µm to 0.10 µm, but is not limited thereto.

The insulating layer 172e is disposed to surround the outer surfaces (e.g., outer peripheral surfaces) of the first semiconductor layer 172a, the second semiconductor layer 172b, the active layer 172c, and the electrode layer 172d. The insulating layer 172e may have a function of protecting the first semiconductor layer 172a, the second semiconductor layer 172b, the active layer 172c, and the electrode layer 172d. In one example, the insulating layer 172e may be formed such that both ends thereof are exposed in the length direction of the light emitting element 172.

FIG. 3 illustrates that the insulating layer 172e extends in the length direction of the light emitting element 172 to cover the area from the first semiconductor layer 172a to the electrode layer 172d, but the present disclosure is not limited thereto. The insulating layer 172e may cover only the outer surface (e.g., an outer peripheral surface) of the active layer 172c and a portion of the outer surfaces (e.g., outer peripheral surfaces) of the first semiconductor layer 172a and the second semiconductor layer 172b. Alternatively, the insulating layer 172e may cover a portion of the outer surface (e.g., an outer peripheral surface) of the electrode layer 172d, so that the part of the outer surface of the electrode layer 172d may be exposed without being covered by the insulating layer 172e.

The thickness of the insulating layer 172e may have a range of 10 nm to 1.0 µm, but is not limited to thereto. In some embodiments, the thickness of the insulating layer 172e may be about 40 nm.

The insulating layer 172e may include materials having insulating properties, for example, silicon oxide (SiOx), silicon nitride (SiNx), silicon oxynitride (SiOxNy), aluminum nitride (AlN), aluminum oxide ($A_2O_3$), and the like. Accordingly, it is possible to prevent an electrical short circuit that may occur when the active layer 172c is in direct contact with the first contact electrode 174 or the second contact electrode 175. In some embodiments, because the insulating layer 172e protects the outer surface (e.g., the outer peripheral surface) of the light emitting element 172 including the active layer 172c, it is possible to prevent or reduce a decrease in light emission efficiency.

Further, the light emitting elements 172 may be contained in a coating solution (e.g., a set or predetermined coating solution) at the time of fabricating the display device 10. At this time, the surface of the insulating layer 172e may be subjected to hydrophobic treatment or hydrophilic treatment so that the light emitting element 172 is separated from another light emitting element 172 adjacent thereto without being aggregated in the coating solution.

The light emitting element 172 may have a length h of 1 µm to 10 µm or 2 µm to 6 µm, and preferably 3 µm to 5 µm. Further, the light emitting element 172 may have a diameter of 30 nm to 700 nm and an aspect ratio of 1.2 to 100. However, the light emitting elements 172 may have different diameters depending on the composition of the active layer 172c. In some embodiments, the diameter of the light emitting element 172 may have a range of about 500 nm.

Figure 4:
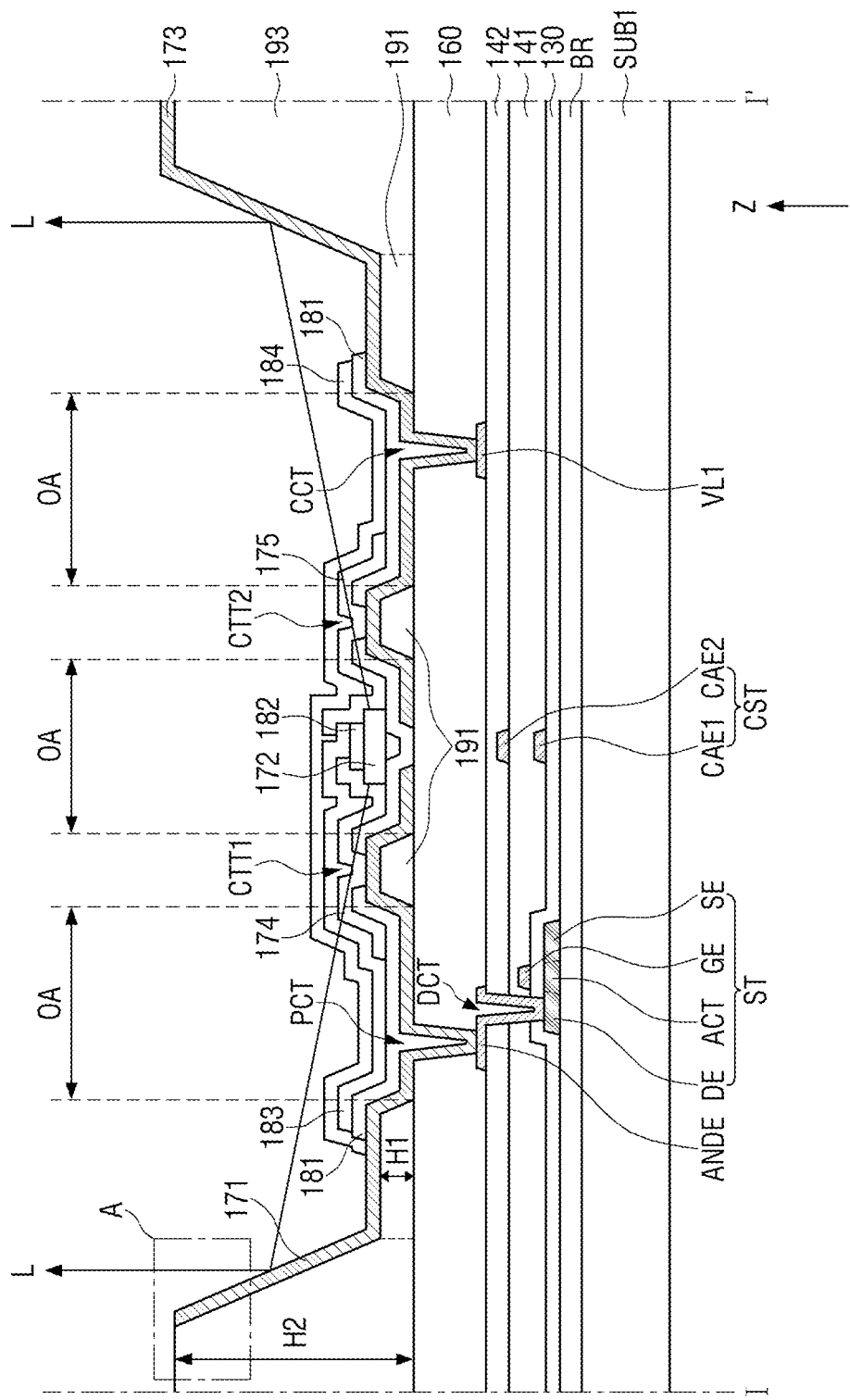
FIG. 4 is a cross-sectional view illustrating an example of a display panel taken along the line I-I' of FIG. 2.
Figure 5:
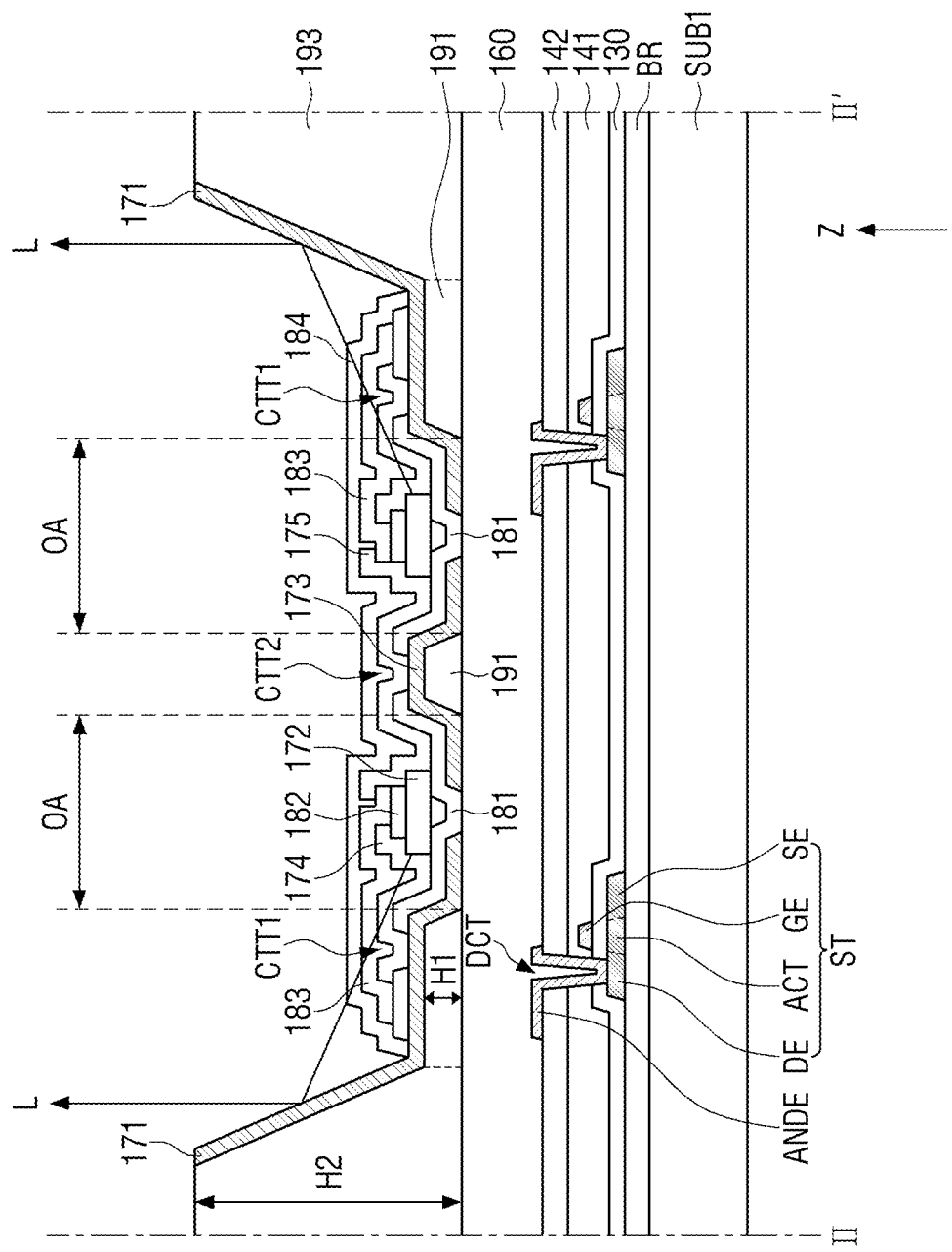
FIG. 5 is a cross-sectional view illustrating an example of a display panel taken along the line II-II' of FIG. 2.

FIG. 4 is a cross-sectional view illustrating an example of a display panel taken along the line I-I' of FIG. 2. FIG. 5 is a cross-sectional view illustrating an example of a display panel taken along the line II-II' of FIG. 2.

Referring to FIGS. 4 and 5, each of the sub-pixels PX1, PX2, and PX3 may include at least one thin film transistor ST, at least one capacitor CST, and the plurality of light emitting elements 172.

A substrate SUB1 may be formed of an insulating material such as glass, quartz, or a polymer resin. The substrate SUB1 may be a rigid substrate or a flexible substrate which can be bent, folded, or rolled.

A barrier layer BR may be disposed on the substrate SUB1. The barrier layer BR is a layer for protecting the thin film transistor ST from moisture permeating through the first substrate SUB1 that is susceptible to moisture permeation. The barrier layer BR may be formed as a plurality of inorganic layers that are alternately stacked. For example, the barrier layer BR may be formed as a multilayer in which inorganic layers including at least one of silicon oxide (SiOx), silicon nitride (SiNx), and silicon oxynitride (SiON) are alternately stacked.

A semiconductor layer including an active layer ACT, a source electrode SE, and a drain electrode DE of a thin film transistor ST may be disposed on the barrier layer BR. The semiconductor layer includes polycrystalline silicon, monocrystalline silicon, low-temperature polycrystalline silicon, amorphous silicon, or an oxide semiconductor. The source electrode SE and the drain electrode DE may have conductivity by doping a silicon semiconductor or an oxide semiconductor with ions or impurities. The active layer ACT may overlap the gate electrode GE in the third direction (Z-axis direction) that is the thickness direction of the substrate SUB1, and the source electrode SE and the drain electrode DE may not overlap the gate electrode GE in the third direction (Z-axis direction).

A gate insulating layer 130 may be disposed on the active layer ACT, the source electrode SE, and the drain electrode DE. The gate insulating layer 130 may include an inorganic layer, e.g., silicon oxide (SiOx), silicon nitride (SiNx), and silicon oxynitride (SiON).

A first gate conductive layer including a gate electrode GE of the thin film transistor ST and a first capacitor electrode CAE1 of a capacitor CST may be disposed on the gate insulating layer 130. The gate electrode GE may overlap the active layer ACT in the third direction (Z-axis direction). The first gate conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A first interlayer insulating layer 141 may be disposed on the gate electrode GE and the first capacitor electrode CAE1. The first interlayer insulating layer 141 may include an inorganic layer, e.g., silicon oxide (SiOx), silicon nitride (SiNx), and silicon oxynitride (SiON).

A second gate conductive layer including a second capacitor electrode CAE2 of the capacitor CST may be disposed on the first interlayer insulating layer 141. Because the first interlayer insulating layer 141 has a dielectric constant (e.g., a set or predetermined dielectric constant), the capacitor CST may be formed by the first capacitor electrode CAE1, the second capacitor electrode CAE2, and the first interlayer insulating layer 141, therebetween. The second capacitor electrode CAE2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A second interlayer insulating layer 142 may be disposed on the second capacitor electrode CAE2. The second interlayer insulating layer 142 may include an inorganic layer, e.g., silicon oxide (SiOx), silicon nitride (SiNx), and silicon oxynitride (SiON).

A data conductive layer including a connection electrode ANDE and a first power supply line VL1 may be disposed on the second interlayer insulating layer 142. The connection electrode ANDE may be connected to the drain electrode DE of the thin film transistor ST through a drain contact hole DCT exposing the drain electrode DE of the thin film transistor ST while penetrating the gate insulating layer 130, the first interlayer insulating layer 141, and the second interlayer insulating layer 142. FIG. 4 illustrates that the connection electrode ANDE is connected to the drain electrode DE of the thin film transistor ST, but the embodiments of the present disclosure are not limited thereto. For example, the connection electrode ANDE may be connected to the source electrode SE of the thin film transistor ST through a source contact hole exposing the source electrode SE while penetrating the gate insulating layer 130, the first interlayer insulating layer 141, and the second interlayer insulating layer 142. A first source voltage may be applied to the first power supply line VL1. The first power supply line VL1 may extend in the first direction (X-axis direction), but is not limited thereto. The data conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A planarization layer 160 for flattening the stepped portion formed by the thin film transistors ST may be disposed on the connection electrode ANDE. The planarization layer 160 may be formed of an organic layer such as acryl resin, epoxy resin, phenolic resin, polyamide resin, polyimide resin and the like.

A partition wall 191, a first bank 193, a first electrode 171, and a second electrode 173 may be disposed on the planarization layer 160.

The partition wall 191 may define an opening OA. The opening OA may be an area where the planarization layer 160 is exposed without being covered by the partition wall 191. The partition wall 191 may include a bottom surface in contact with the first planarization layer 160, a top surface opposite to the bottom surface, and side surfaces between the top surface and the bottom surface. Each of the side surfaces of the partition wall 191 may have a trapezoidal cross-section, but is not limited thereto.

The first bank 193 may be formed integrally with the partition wall 191. A height H2 (length in the third direction (Z-axis direction)) of the first bank 193 may be greater than a height H1 (length in the third direction (Z-axis direction)) of the partition wall 191. The first bank 193 may include a bottom surface in contact with the first planarization layer 160, a top surface opposite to the bottom surface, and side surfaces between the top surface and the bottom surface. Each of the side surfaces of the first bank 193 may have a trapezoidal cross-section, but is not limited thereto.

The partition wall 191 and the first bank 193 may be formed of an organic layer such as photosensitive resin, acryl resin, epoxy resin, phenolic resin, polyamide resin, polyimide resin and the like. For example, when the partition wall 191 and the first bank 193 are made of photosensitive resin, it may be a positive photoresist or a negative photoresist.

The first electrode 171 may be disposed on the partition wall 191 and the first bank 193. The first electrode 171 may be disposed on at least one side surface and the top surface of the partition wall 191. The first electrode 171 may be disposed on at least one side surface of the first bank 193.

Figure 6:
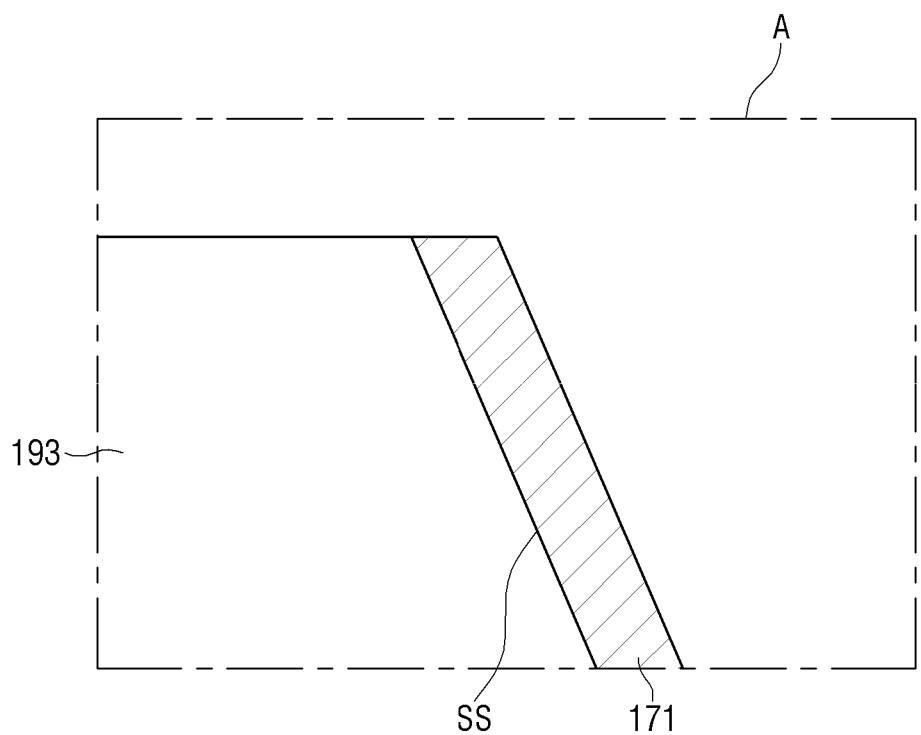
FIG. 6 is an enlarged cross-sectional view illustrating an example of area A of FIG. 4 in detail.
Figure 7:
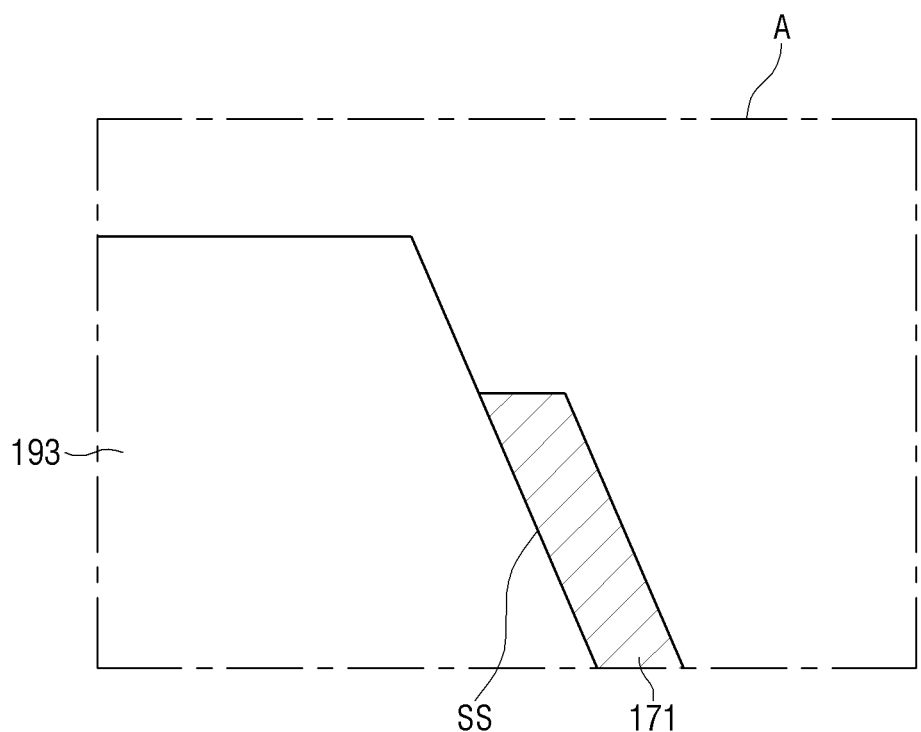
FIG. 7 is an enlarged cross-sectional view illustrating another example of area A of FIG. 4 in detail.
Figure 8:
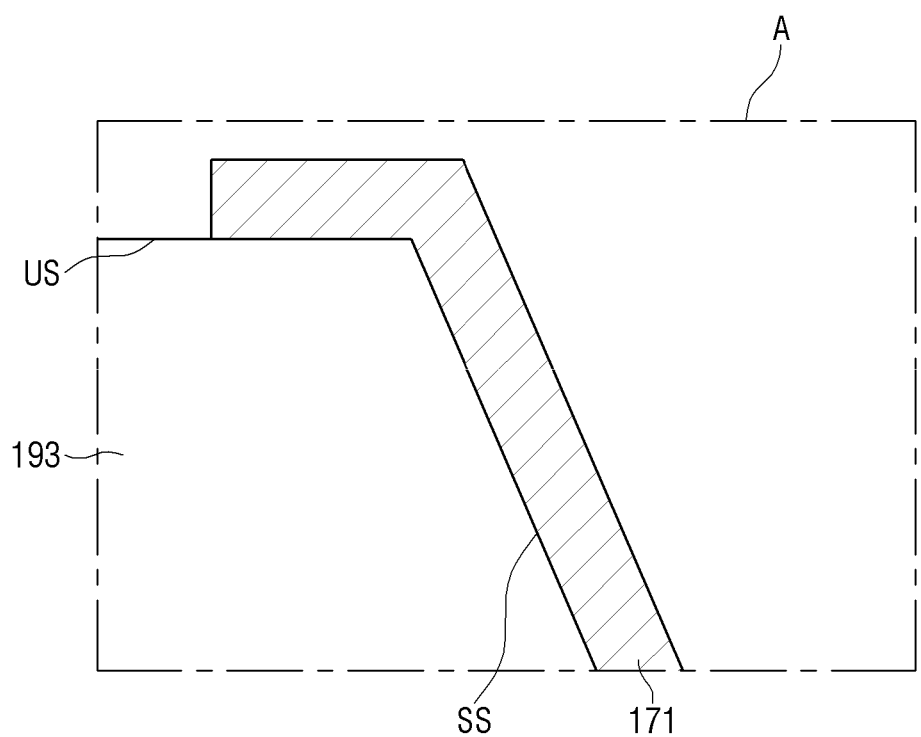
FIG. 8 is an enlarged cross-sectional view showing still another example of area A of FIG. 4 in detail.

For example, the first electrode 171 may cover at least one entire side surface SS of the first bank 193 as shown in FIG. 6. Alternatively, the first electrode 171 may not be disposed on a portion of at least one side surface SS of the first bank 193 so that the part of at least one side surface SS of the first bank 193 is exposed as shown in FIG. 7. For example, the first electrode 171 may not be disposed on the upper portion of at least one side surface SS of the first bank 193 so that the upper portion of at least one side surface SS of the first bank 193 is exposed as shown in FIG. 7. Alternatively, the first electrode 171 may cover at least one entire side surface SS and a portion of the top surface US of the first bank 193 as shown in FIG. 8.

The second electrode 173 may be disposed on the partition wall 191 and the first bank 193. The second electrode 173 may be disposed on at least one side surface and the top surface of the partition wall 191. The second electrode 173 may be disposed on at least one side surface and the top surface of the first bank 193.

The second electrode 173 of any one sub-pixel may be connected to the second electrode 173 of the sub-pixel adjacent thereto in the second direction (Y-axis direction) over the first bank 193.

The first electrode 171 and the second electrode 173 may be disposed in the opening OA. The first electrode 171 may be connected to the connection electrode ANDE through the pixel contact hole PCT penetrating the planarization layer 160 in the opening OA. Accordingly, the first electrode 171 may be connected to the drain electrode DE of the thin film transistor ST. The second electrode 173 may be connected to the first power supply line VL1 through the common contact hole CCT penetrating the planarization layer 160 in the opening OA. The second electrode 173 may extend in the second direction (Y-axis direction), and the first power supply line VL1 may extend in the first direction (X-axis direction). In this case, the second electrode 173 may be commonly connected to a plurality of sub-pixels. In some embodiments, the second electrode 173 may be a common electrode commonly connected to the sub-pixels PX1, PX2, and PX3 also.

The first electrode 171 and the second electrode 173 may include a conductive material having high reflectivity. For example, the first electrode 171 and the second electrode 173 may include a metal such as silver (Ag), copper (Cu), and aluminum (Al). Accordingly, among the light emitted from the light emitting element 172, the light traveling toward the first electrode 171 and the second electrode 173 may move to the position above the light emitting element 172 at the first electrode 171 and the second electrode 173.

For example, because the first electrode 171 and the second electrode 173 are disposed on the side surface of the first bank 193, among the light emitted from the light emitting element 172, the light L traveling in the lateral direction of the light emitting element 172 may be reflected by the first electrode 171 or the second electrode 173 disposed on the side surface of the first bank 193 and move to the position above the light emitting element 172. Therefore, the rate at which the light emitted from the light emitting element 172 is lost may be reduced, which makes it possible to increase the light emission efficiency of the light emitted from the light emitting element 172.

A first insulating layer 181 may be disposed on the first electrode 171 and the second electrode 173. The first insulating layer 181 may be disposed on the planarization layer 160 that is exposed without being covered by the first electrode 171 and the second electrode 173. The first insulating layer 181 may include an inorganic layer, e.g., silicon oxide (SiOx), silicon nitride (SiNx), and silicon oxynitride (SiON).

The light emitting elements 172 may be disposed on the first insulating layer 181 in the opening OA. A second insulating layer 182 may be disposed on the light emitting elements 172. The second insulating layer 182 may include an inorganic layer, e.g., silicon oxide (SiOx), silicon nitride (SiNx), and silicon oxynitride (SiON).

The first contact electrode 174 may be connected to the first electrode 171 through the first contact hole CTT1 penetrating the first insulating layer 181. The first contact hole CTT1 may overlap the partition wall 191 in the third direction (Z-axis direction). The first contact electrode 174 may be in contact with a first end of the light emitting element 172. Accordingly, the first end of the light emitting element 172 may be electrically connected to the first electrode 171 through the first contact electrode 174. The first contact electrode 174 may be disposed on the second insulating layer 182.

The second contact electrode 175 may be connected to the second electrode 173 through the second contact hole CTT2 penetrating the first insulating layer 181. The second contact hole CTT2 may overlap the partition wall 191 in the third direction (Z-axis direction). The second contact electrode 175 may be in contact with a second end of the light emitting element 172. Accordingly, the second end of the light emitting element 172 may be electrically connected to the second electrode 173 through the second contact electrode 175. The second contact electrode 175 may be disposed on the second insulating layer 182.

The first and second contact electrodes 174 and 175 may be made of transparent conductive oxide (TCO) such as indium tin oxide (ITO) and indium zinc oxide (IZO) capable of transmitting light. It is possible to prevent or reduce the light emitted from the light emitting elements 172 from being blocked by the first contact electrode 174 and the second contact electrode 175.

A third insulating layer 183 may be disposed on the first contact electrode 174 and the second insulating layer 182. The third insulating layer 183 may be disposed to cover the first contact electrode 174 in order to electrically separate the first contact electrode 174 from the second contact electrode 175. The second contact electrode 175 may be disposed on the second insulating layer 182 and the third insulating layer 183. The third insulating layer 183 may include an inorganic layer, e.g., silicon oxide (SiOx), silicon nitride (SiNx), and silicon oxynitride (SiON).

First ends of the light emitting elements 172 are electrically connected to the drain electrode DE of the thin film transistor ST through the first contact electrode 174 and the first electrode 171, and the second ends of the light emitting elements 172 are connected to the first power supply line VL1 through the second contact electrode 175 and the second electrode 173. Therefore, each of the light emitting elements 172 may emit light by the current flowing from the first end to the second end thereof.

A fourth insulating layer 184 may be disposed on the second insulating layer 182 and the third insulating layer 183. The fourth insulating layer 184 may include an inorganic layer, e.g., silicon oxide (SiOx), silicon nitride (SiNx), and silicon oxynitride (SiON). In some embodiments, the fourth insulating layer 184 may be omitted.

As shown in FIGS. 4 and 5, the partition wall 191 defining the opening OP and the first bank 193 serving as a dam that traps a coating solution containing the light emitting elements 172 in the process of aligning the light emitting elements 172 between the first electrode 171 and the second electrode 173 are integrally and concurrently formed (or simultaneously formed). Accordingly, the cost of the mask can be reduced and, further, the manufacturing cost can be reduced.

Figure 9:
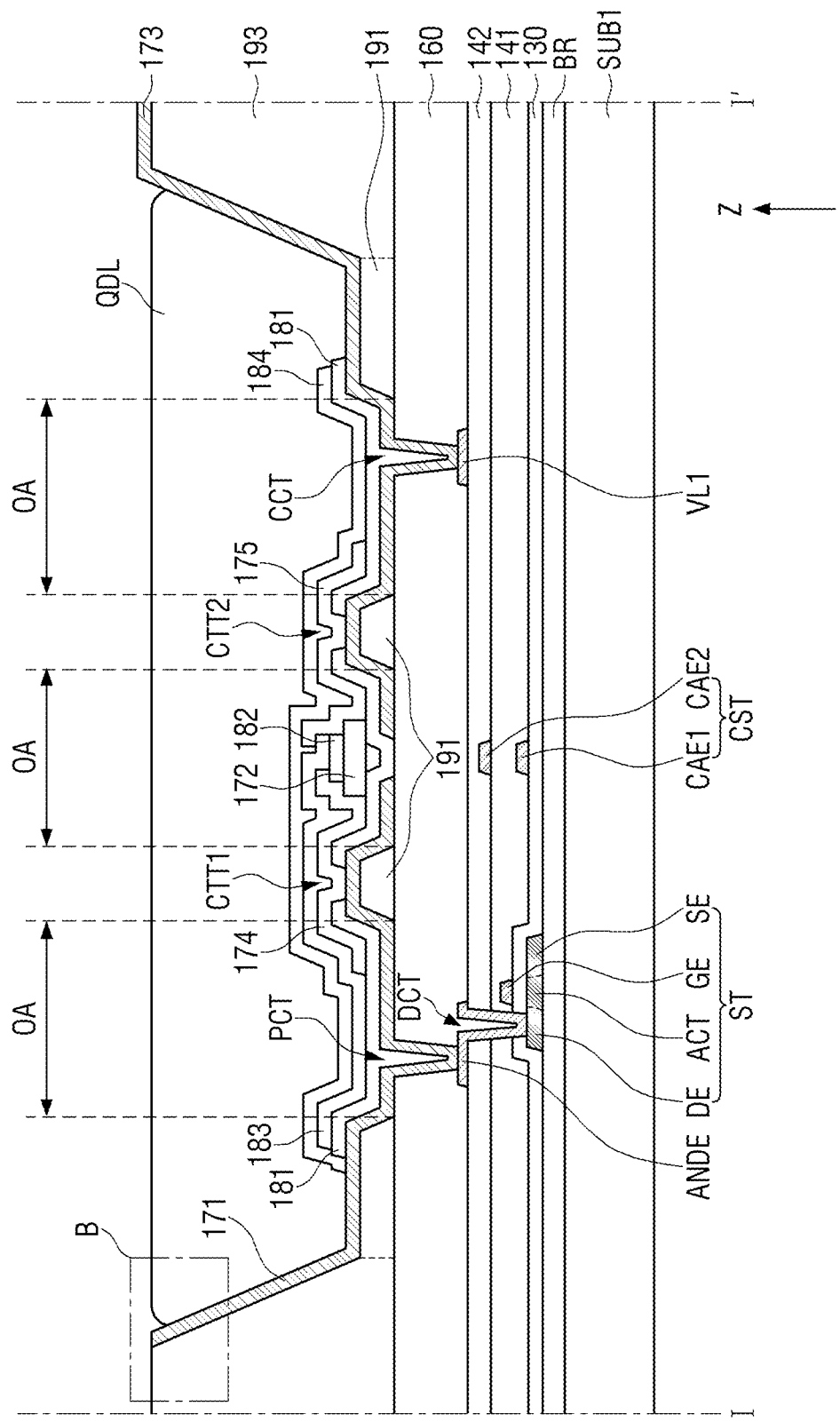
FIG. 9 is a cross-sectional view illustrating another example of a display panel taken along the line I-I' of FIG. 2.
Figure 10:
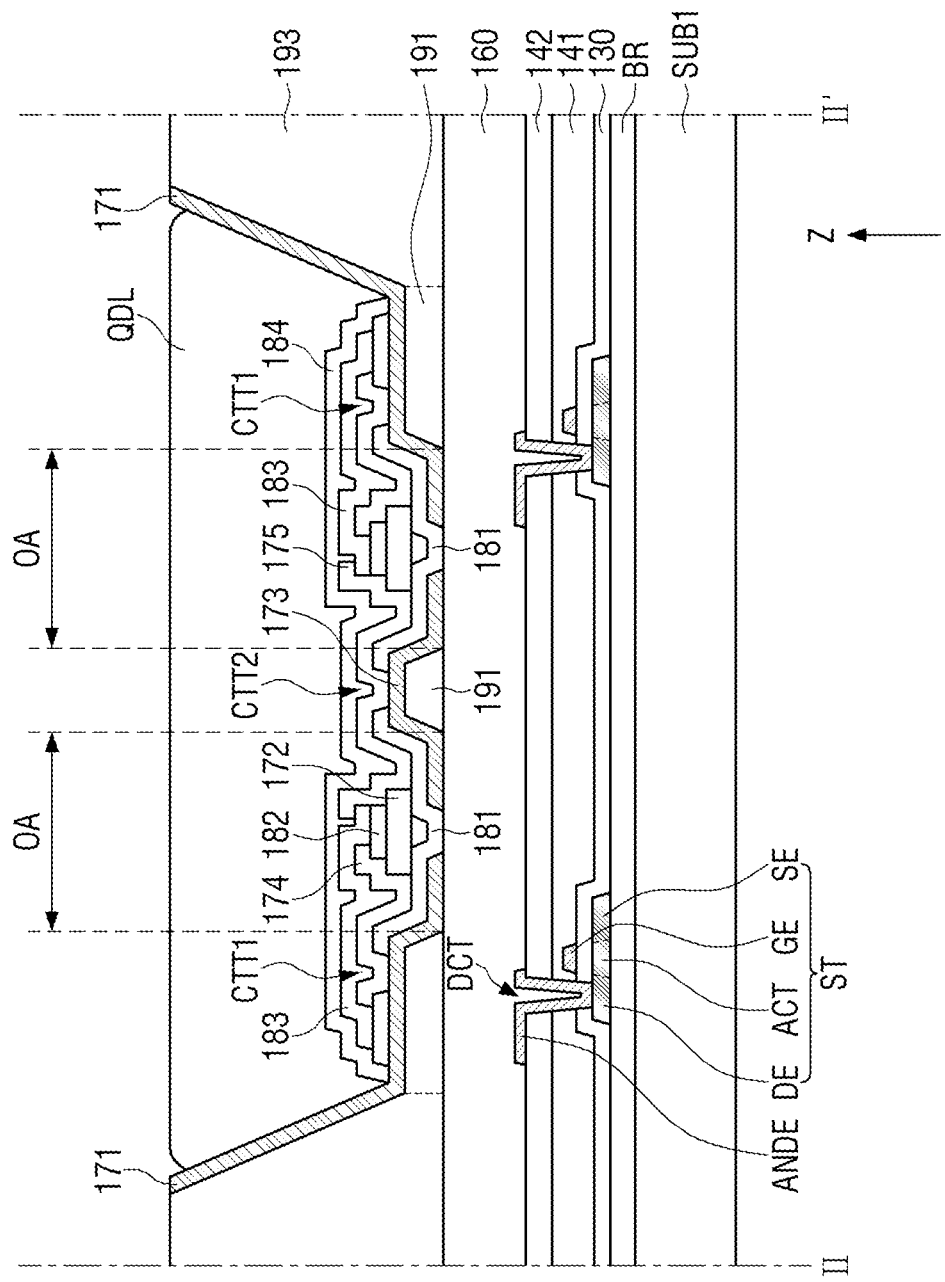
FIG. 10 is a cross-sectional view illustrating another example of a display panel taken along the line II-II' of FIG. 2.

FIG. 9 is a cross-sectional view illustrating another example of a display panel taken along the line I-I' of FIG. 2. FIG. 10 is a cross-sectional view illustrating another example of a display panel taken along the line II-II' of FIG. 2.

The embodiment of FIGS. 9 and 10 is different from the embodiment of FIGS. 4 and 5 in that a wavelength conversion layer QDL or a transparent insulating layer is disposed on the light emitting elements 172. The description being made with reference to FIGS. 9 and 10 is mainly directed to the differences from the embodiment of FIGS. 4 and 5.

Referring to FIGS. 9 and 10, a first wavelength conversion layer QDL may be disposed in the first sub-pixel PX1, a second wavelength conversion layer may be disposed in the second sub-pixel PX2, and the transparent insulating layer may be disposed in the third sub-pixel PX3. The light emitting elements 172 of the first sub-pixel PX1, the second sub-pixel PX2, and the third sub-pixel PX3 may emit the third color light. The third color light may be short-wavelength light, such as blue light or ultraviolet light, having a central wavelength band of 370 nm to 490 nm.

The first wavelength conversion layer QDL may convert the third light emitted from the light emitting elements 172 of the first sub-pixel PX1 into the first color light. The first color light may be red light having a central wavelength band of 600 nm to 750 nm.

The second wavelength conversion layer may convert the third light emitted from the light emitting elements 172 of the second sub-pixel PX2 into the second color light. The second color light may be green light having a central wavelength band of 480 nm to 560 nm.

Each of the first wavelength conversion layer QDL and the second wavelength conversion layer may include base resin, a wavelength shifter, and a scatterer.

The base resin may be a material having high light transmittance and an excellent dispersion property with respect to the wavelength shifter and the scatterer. For example, the base resin may include an organic material such as epoxy resin, acrylic resin, cardo resin, or imide resin.

The wavelength shifter may convert or shift the wavelength range of incident light. The wavelength shifter may be a quantum dot, a quantum rod, or a phosphor. The size of the quantum dot in the first wavelength conversion layer QDL and the size of the quantum dot in the second wavelength conversion layer may be different.

The scatterer may scatter the incident light in random directions without substantially converting the wavelength of the light passing through the first wavelength conversion layer QDL or the second wavelength conversion layer. Accordingly, the path length of the light passing through the first wavelength conversion layer QDL or the second wavelength conversion layer can be increased, which makes it possible to increase the color conversion efficiency by the wavelength shifter. The scatterer may be a light scattering particle. For example, the scatterer may be a metal oxide particle such as titanium oxide ($TiO_2$), silicon oxide ($SiO_2$), zirconium oxide (ZrO$_2$), aluminum oxide (Al$_2$O$_3$), indium oxide (In$_2$O$_3$), zinc oxide (ZnO), tin oxide (SnO$_2$), or the like. Alternatively, the scatterer may be an organic particle such as acrylic resin or urethane resin.

The transparent insulating layer may allow the short-wavelength light such as blue light or ultraviolet light to pass therethrough. The transparent insulating layer may be formed of an organic layer having high transmittance.

The first wavelength conversion layer QDL may be disposed on the fourth insulating layer 184 in the first sub-pixel PX1. The first wavelength conversion layer QDL may be disposed on the first electrode 171 covering at least one side surface of the first bank 193 and on the second electrode 173 covering at least one side surface of the first bank 193 in the first sub-pixel PX1.

The first wavelength conversion layer QDL is in contact with the first electrode 171 covering at least one side surface of the first bank 193 and the second electrode 173 covering at least one side surface of the first bank 193. Because the first electrode 171 and the second electrode 173 are conductive materials having high reflectivity, such as silver (Ag), copper (Cu), aluminum (Al), or the like, the first conversion layer QDS may have a hydrophobic property. In this case, the first wavelength conversion layer QDL tends to be in contact with the minimum area of the first electrode 171 and the second electrode 173, and may be convex upward as shown in FIG. 11.

On the other hand, when the first electrode 171 and the second electrode 173 are not disposed at least one side surface of the first bank 193, the first wavelength conversion layer QDL may be in contact with the first bank 193. When the first bank 193 is a photoresist, the first wavelength conversion layer QDL may have a hydrophilic property. In this case, the first wavelength conversion layer QDL tends to be in contact with the maximum area of the first bank 193, and may be convex downward as shown in FIG. 12.

Figure 11:
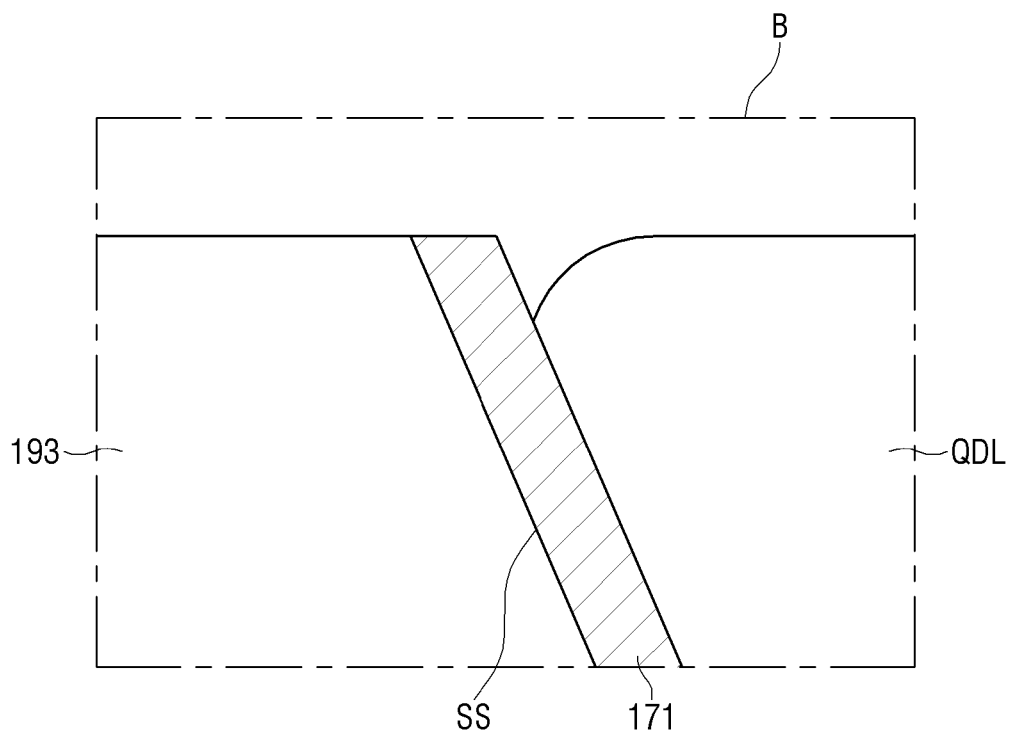
FIG. 11 is an enlarged cross-sectional view illustrating an example of area B of FIG. 9 in detail.
Figure 12:
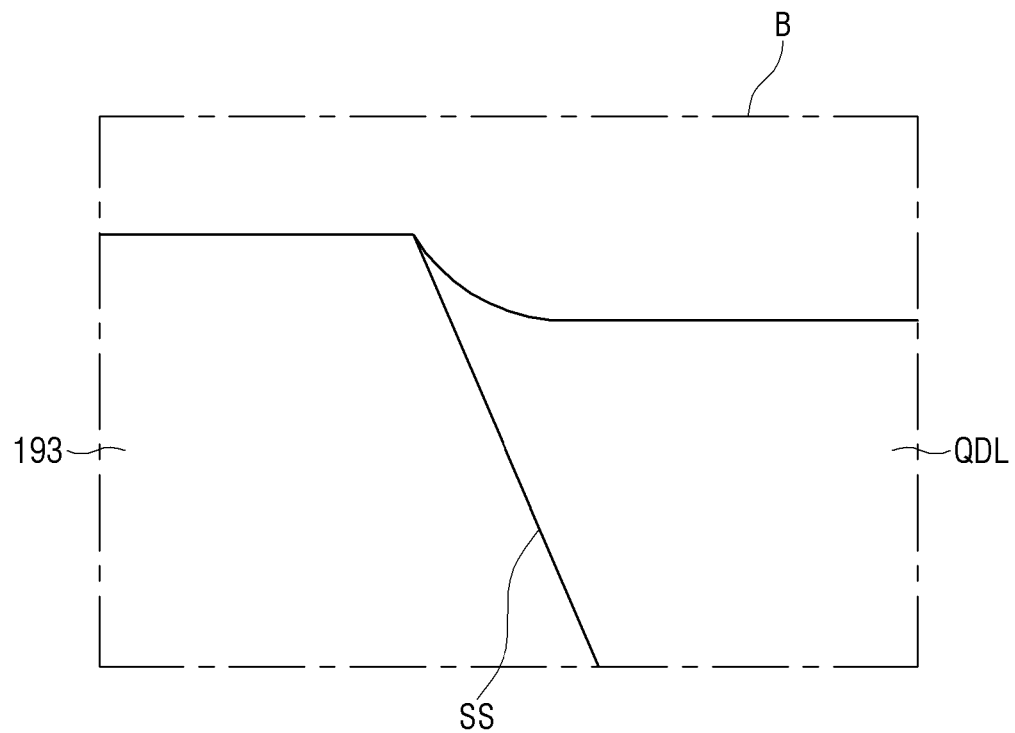
FIG. 12 is an enlarged cross-sectional view illustrating in detail a case in which a first electrode is omitted in area B of FIG. 9.

The volume of the first wavelength conversion layer QDL may be greater when the first wavelength conversion layer QDL is convex upward as shown in FIG. 11 than when the first wavelength conversion layer QDL is convex downward as shown in FIG. 12. As the volume of the first wavelength conversion layer QDL increases, the rate at which the third light emitted from the light emitting elements 172 of the first sub-pixel PX1 is converted into the first light by the first wavelength conversion layer QDL may be increased. In other words, as the volume of the first wavelength conversion layer QDL increases, the light emission efficiency of the light emitted from the light emitting elements 172 may also increase.

Further, the light traveling in the lateral direction by the wavelength shifter and the scatterer of the first wavelength conversion layer QDL may be reflected upward by the first electrode 171 covering at least one side surface of the first bank 193 and the second electrode 173 covering at least one side surface of the first bank 193. Therefore, the rate at which the light emitted from the light emitting element 172 is lost may be reduced, which makes it possible to increase the light emission efficiency of the light emitted from the light emitting element 172. In this case, the light emission efficiency of the light emitted from the light emitting element 172 may be increased without a low refractive organic layer disposed on the first wavelength conversion layer QDL. Because the low refractive organic layer is omitted, the manufacturing cost can be reduced.

In some embodiments, the arrangement of the second wavelength conversion layer disposed in the second sub-pixel PX2 and the arrangement of the transparent insulating layer disposed in the third sub-pixel PX3 are substantially the same as the arrangement of the first wavelength conversion layer QDL, so that the description of the arrangement of the second wavelength conversion layer and the arrangement of the transparent insulating layer will be omitted.

A first color filter may be disposed on the first wavelength conversion layer QDL. The first color filter may transmit first color light, e.g., light of a red wavelength band. Therefore, among the short-wavelength light emitted from the light emitting elements 172 of the first sub-pixel PX1, the light that has not been converted into the first color light may not pass through the first color filter. On the other hand, the first color light converted by the first wavelength conversion layer QDL may pass through the first color filter.

A second color filter may be disposed on the second wavelength conversion layer. The second color filter may transmit second color light, e.g., light of a green wavelength band. Therefore, among the short-wavelength light emitted from the light emitting elements 172 of the second sub-pixel PX2, the light that has not been converted into the second color light may not pass through the second color filter. On the other hand, the second color light converted by the second wavelength conversion layer may pass through the second color filter.

A third color filter may be disposed on the transparent insulating layer. The third color filter may transmit third color light, e.g., light of a blue wavelength band. Therefore, the short-wavelength light emitted from the light emitting elements 172 of the third sub-pixel PX3 may pass through the third color filter.

A black matrix may be disposed on the color filters. The black matrix may be disposed between the color filters. The black matrix may contain a light blocking material that can block light. In this case, the black matrix may contain an inorganic black pigment such as carbon black or the like, or may contain an organic black pigment.

Figure 13:
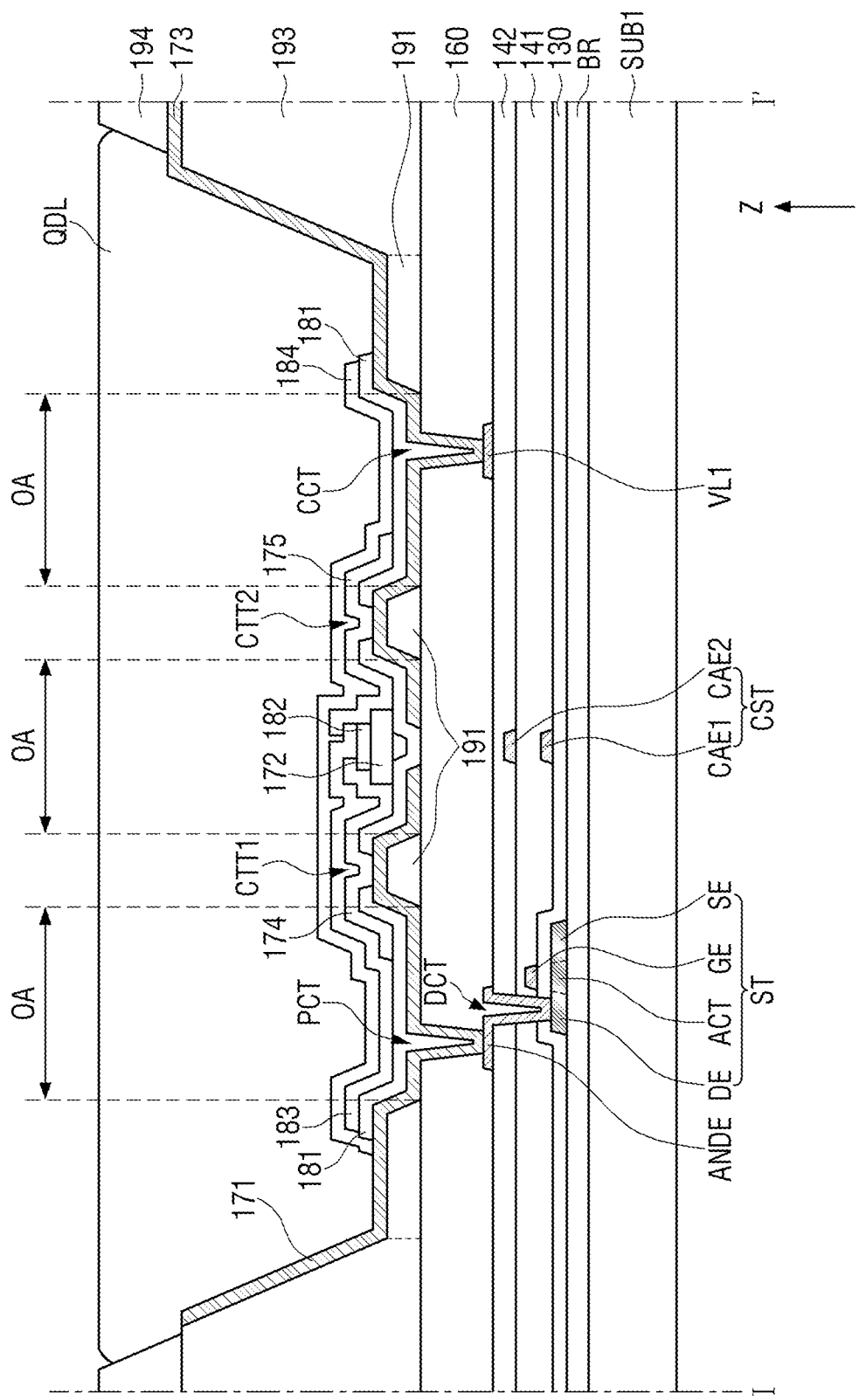
FIG. 13 is a cross-sectional view illustrating still another example of a display panel taken along the line I-I' of FIG. 2.
Figure 14:
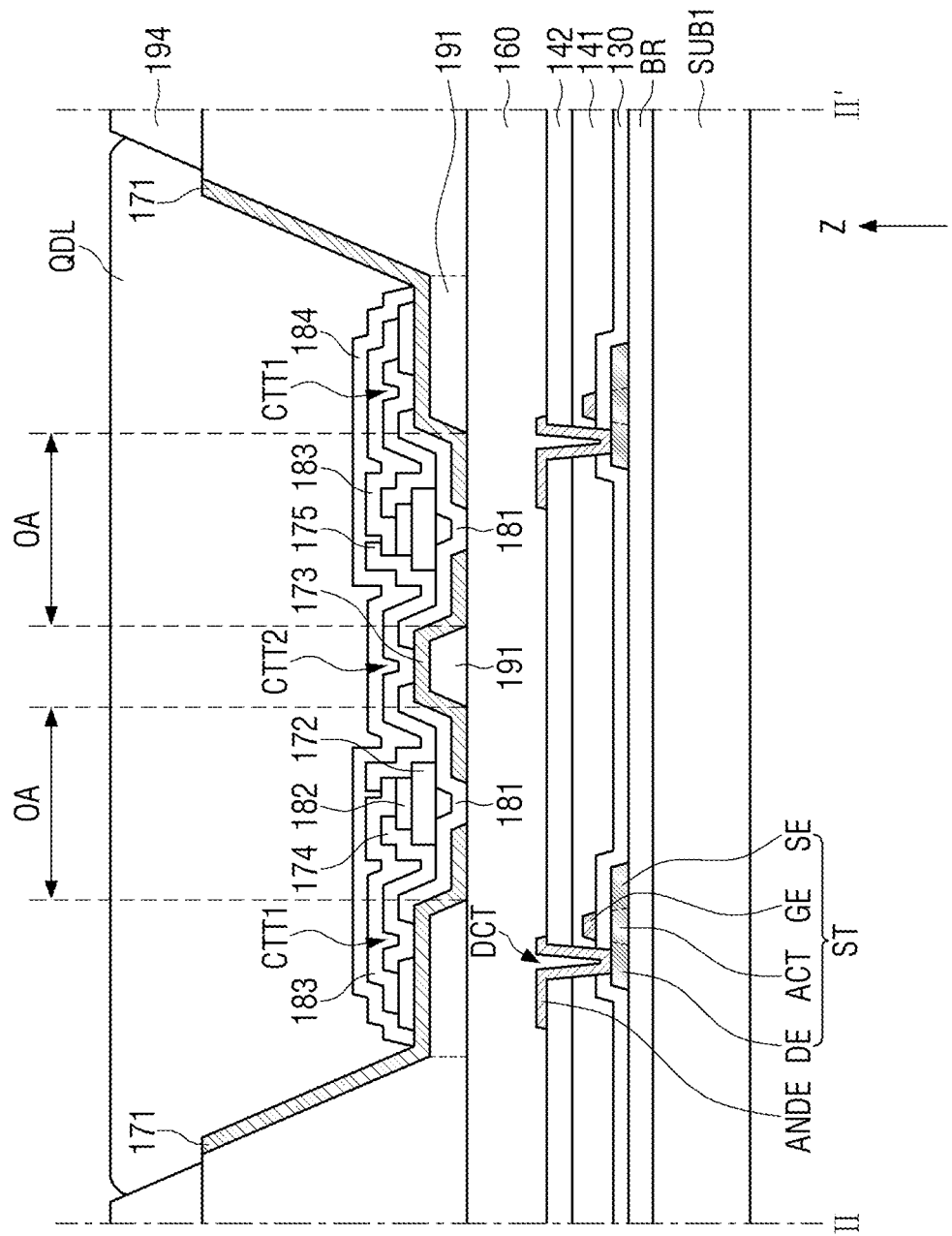
FIG. 14 is a cross-sectional view illustrating still another example of a display panel taken along the line II-II' of FIG. 2.

FIG. 13 is a cross-sectional view illustrating still another example of a display panel taken along the line I-I' of FIG. 2. FIG. 14 is a cross-sectional view illustrating still another example of a display panel taken along the line II-II' of FIG. 2.

The embodiment of FIGS. 13 and 14 is different from the embodiment of FIGS. 4 and 5 in that a second bank 194 is disposed on the first bank 193 and a wavelength conversion layer QDL is disposed on the fourth insulating layer 184. The description being made with reference to FIGS. 13 and 14 is mainly directed to the differences from the embodiment of FIGS. 4 and 5.

Referring to FIGS. 13 and 14, the second bank 194 may be disposed on the first bank 193. The height (length in the third direction (Z-axis direction)) of the second bank 194 may be lower than the height (length in the third direction (Z-axis direction)) of the first bank 193. The area of the second bank 194 may be smaller than the area of the first bank 193. A portion of the top surface of the first bank 193 may be exposed without being covered by the second bank 194.

The second bank 194 may be formed of an organic layer such as photosensitive resin, acryl resin, epoxy resin, phenolic resin, polyamide resin, polyimide resin and the like. For example, when the second bank 194 is made of photosensitive resin, it may be a positive photoresist or a negative photoresist.

The first wavelength conversion layer QDL may be disposed on the fourth insulating layer 184 in the first sub-pixel PX1. The first wavelength conversion layer QDL may be disposed on the first electrode 171 covering at least one side surface of the first bank 193 and on the second electrode 173 covering at least one side surface of the first bank 193 in the first sub-pixel PX1. The first wavelength conversion layer QDL may be disposed on the top surface of the first bank 193 that is exposed without being covered by the second bank 194. The first wavelength conversion layer QDL may be disposed on at least one side surface of the second bank 194. The height of the top surface of the first wavelength conversion layer QDL may be higher than the height of the top surface of the first bank 193 and may be lower than the height of the top surface of the second bank 194.

The volume of the first wavelength conversion layer QDL may be greater when the second bank 194 is included as shown in FIGS. 13 and 14 than when the second bank 194 is not included as shown in FIGS. 9 and 10. As the volume of the first wavelength conversion layer QDL increases, the rate at which the third color light emitted from the light emitting elements 172 of the first sub-pixel PX1 is converted into the first color light by the first wavelength conversion layer QDL may be increased. In other words, as the volume of the first wavelength conversion layer QDL increases, the light emission efficiency of the light emitted from the light emitting elements 172 may also increase.

In some embodiments, the description of the first wavelength conversion layer QDL will be omitted because it is substantially the same as described with reference to FIGS. 9 and 10.

Figure 15:
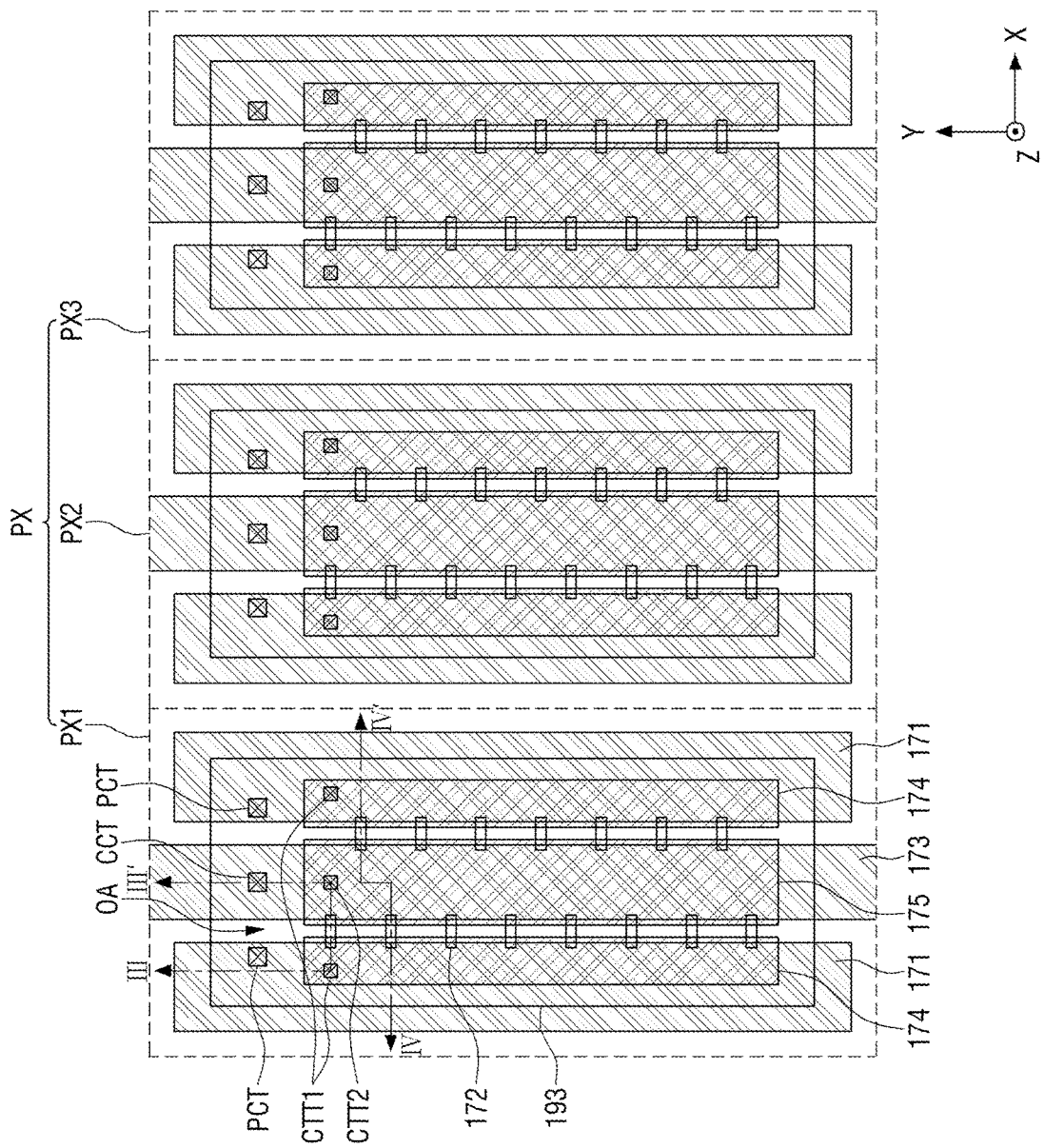
FIG. 15 is a plan view illustrating another example of a pixel in a display area of a display panel of FIG. 1.

FIG. 15 is a plan view illustrating another example of a pixel in a display area of a display panel of FIG. 1.

The embodiment of FIG. 15 is different from the embodiment of FIG. 2 in that the partition wall 191 is omitted in each of the sub-pixels PX1, PX2, and PX3. The description being made with reference to FIG. 15 is mainly directed to the differences from the embodiment of FIG. 2.

Referring to FIG. 15, the opening OA may be defined by the first bank 193. The first contact electrodes 174, the second contact electrode 175, the first contact holes CTT1, and the second contact hole CTT2 as well as the light emitting elements 172, the pixel contact holes PCT, and the common contact hole CCT may be disposed in the opening OA.

Figure 16:
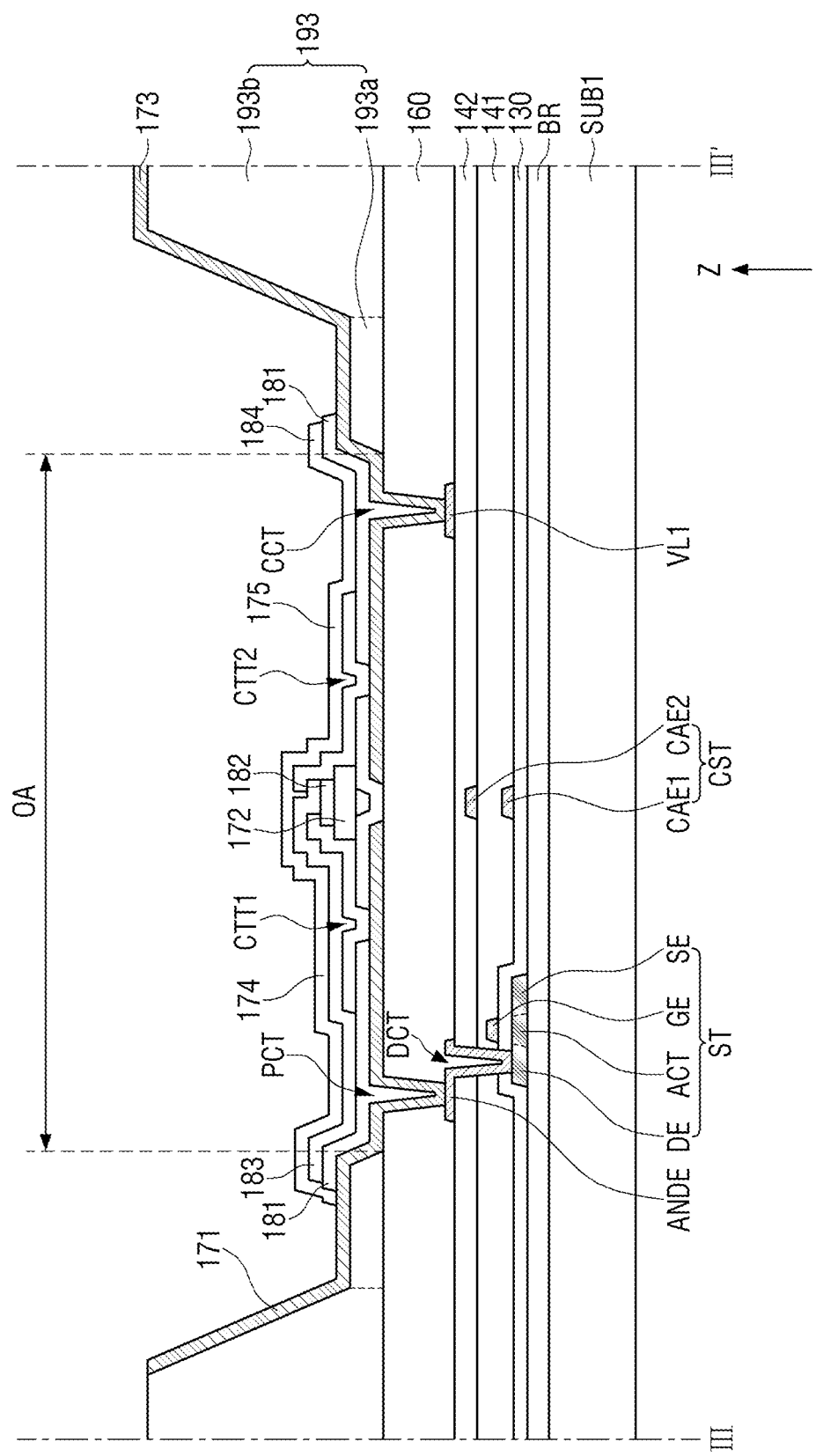
FIG. 16 is a cross-sectional view illustrating an example of a display panel taken along the line III-III' of FIG. 15.
Figure 17:
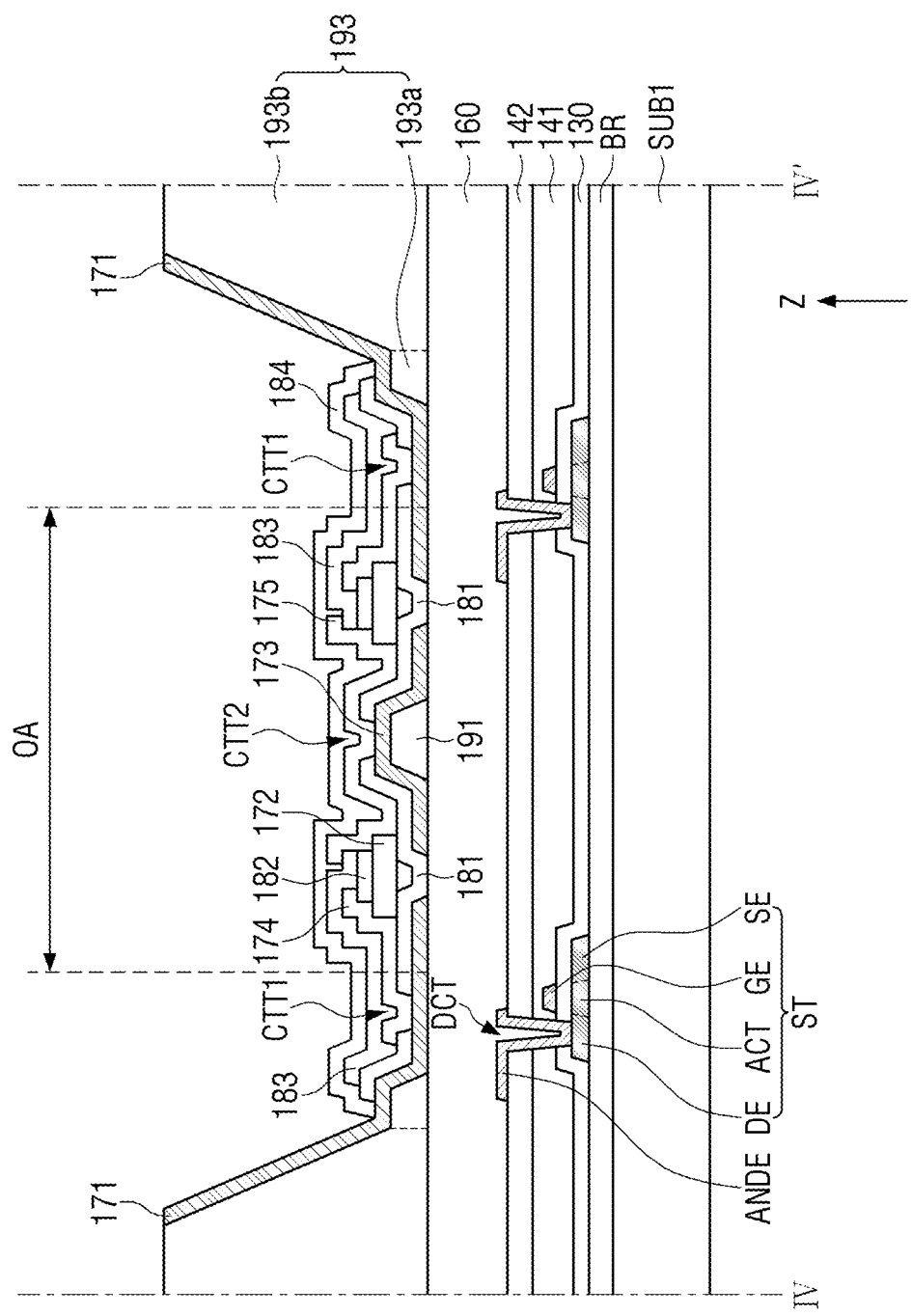
FIG. 17 is a cross-sectional view illustrating an example of a display panel taken along the line IV-IV' of FIG. 15.

FIG. 16 is a cross-sectional view illustrating an example of a display panel taken along the line III-III' of FIG. 15. FIG. 17 is a cross-sectional view illustrating an example of a display panel taken along line IV-IV' of FIG. 15.

The embodiment of FIGS. 16 and 17 is different from the embodiment of FIGS. 4 and 5 in that the partition wall 191 is omitted. The description being made with reference to FIGS. 16 and 17 is mainly directed to the differences from the embodiment of FIGS. 4 and 5.

Referring to FIGS. 16 and 17, a first bank 193 includes a first sub-bank 193*a* and a second sub-bank 193*b*. The first sub-bank 193*a* may be integrally formed with the second sub-bank 193*b*. The height H1 (length in the third direction (Z-axis direction)) of the first sub-bank 193*a* may be lower than the height H2 (length in the third direction (Z-axis direction)) of the second sub-bank 193*b*.

The first electrode 171 may be disposed on at least one side surface and the top surface of the first sub-bank 193*a* and may be disposed on at least one side surface of the second sub-bank 193*b*. The second electrode 173 may be disposed on at least one side surface and the top surface of the first sub-bank 193*a* and may be disposed on at least one side surface and the top surface of the second sub-bank 193*b*.

The first sub-bank 193*a* and the second sub-bank 193*b* may be formed of an organic layer such as photosensitive resin, acryl resin, epoxy resin, phenolic resin, polyamide resin, polyimide resin and the like. For example, when the first sub-bank 193*a* and the second sub-bank 193*b* are formed of photosensitive resin, it may be a positive photoresist or a negative photoresist.

Figure 18:
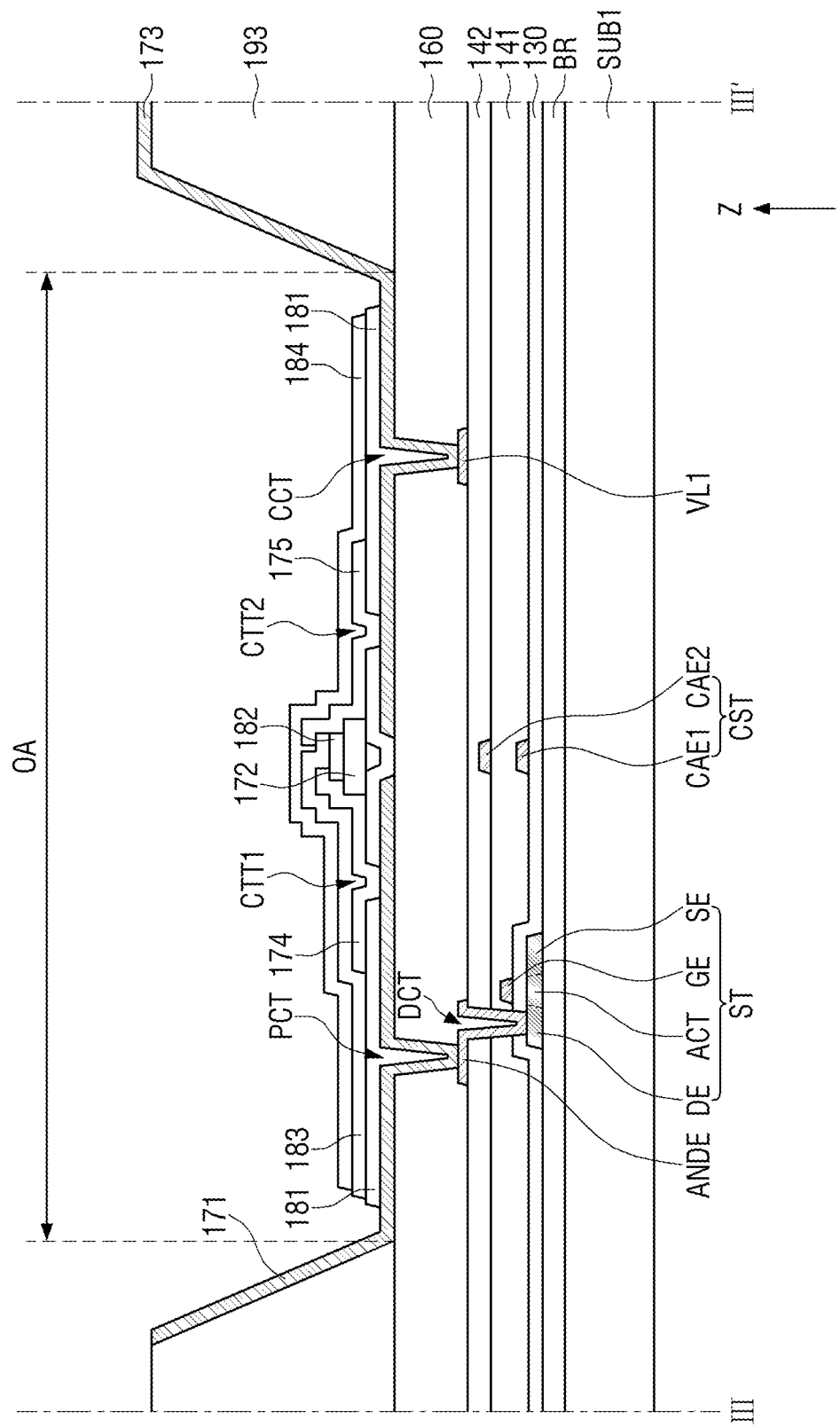
FIG. 18 is a cross-sectional view illustrating another example of a display panel taken along the line III-III' of FIG. 15.
Figure 19:
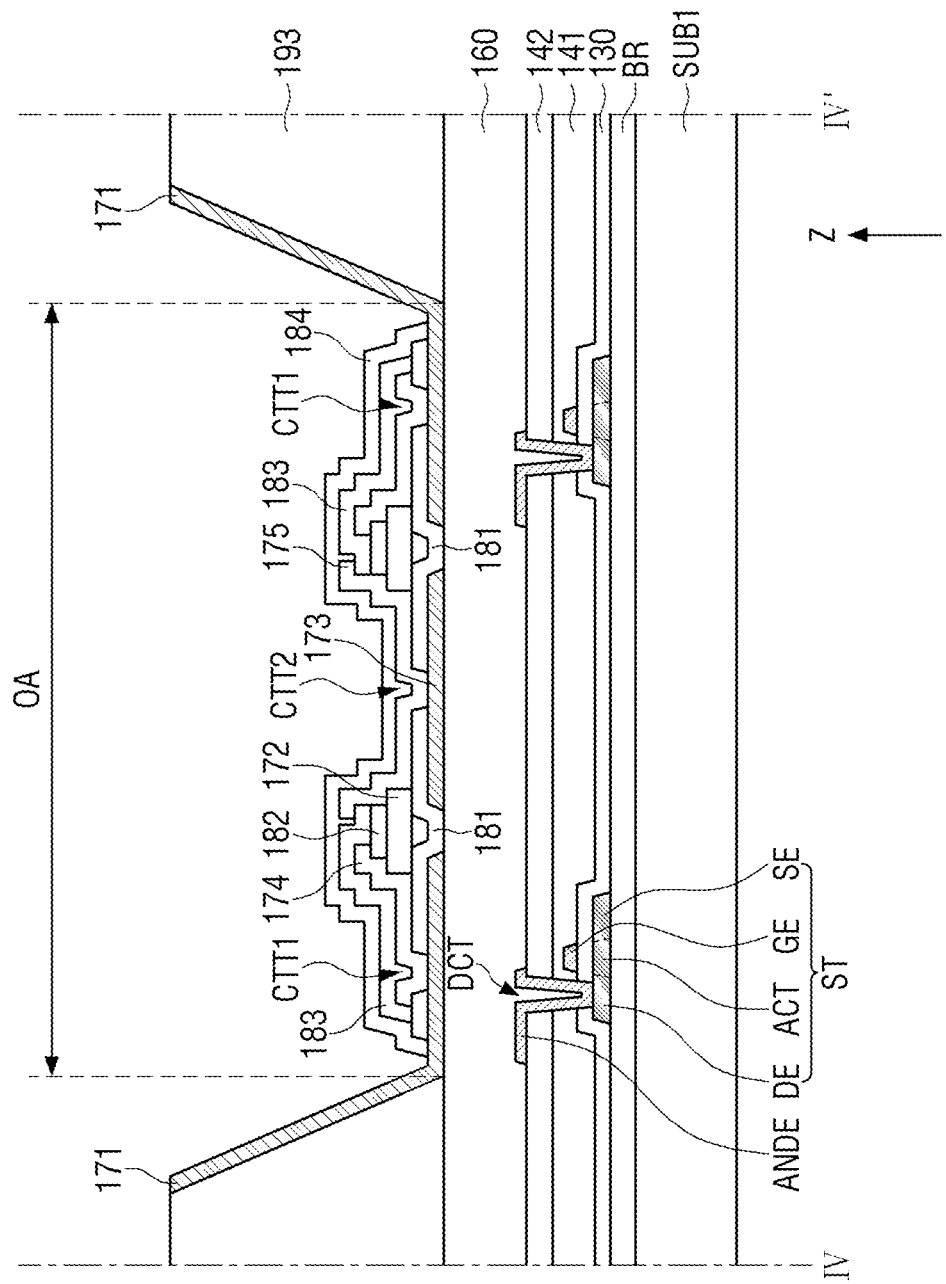
FIG. 19 is a cross-sectional view illustrating another example of a display panel taken along the line IV-IV' of FIG. 15.

FIG. 18 is a cross-sectional view illustrating another example of a display panel taken along the line III-III' of FIG. 15. FIG. 19 is a cross-sectional view illustrating another example of a display panel taken along the line IV-IV' of FIG. 15.

The embodiment of FIGS. 18 and 19 is different from the embodiment of FIGS. 4 and 5 simply in that the partition wall 191 is omitted, so that the detailed description of FIGS. 18 and 19 will be omitted.

Figure 20:
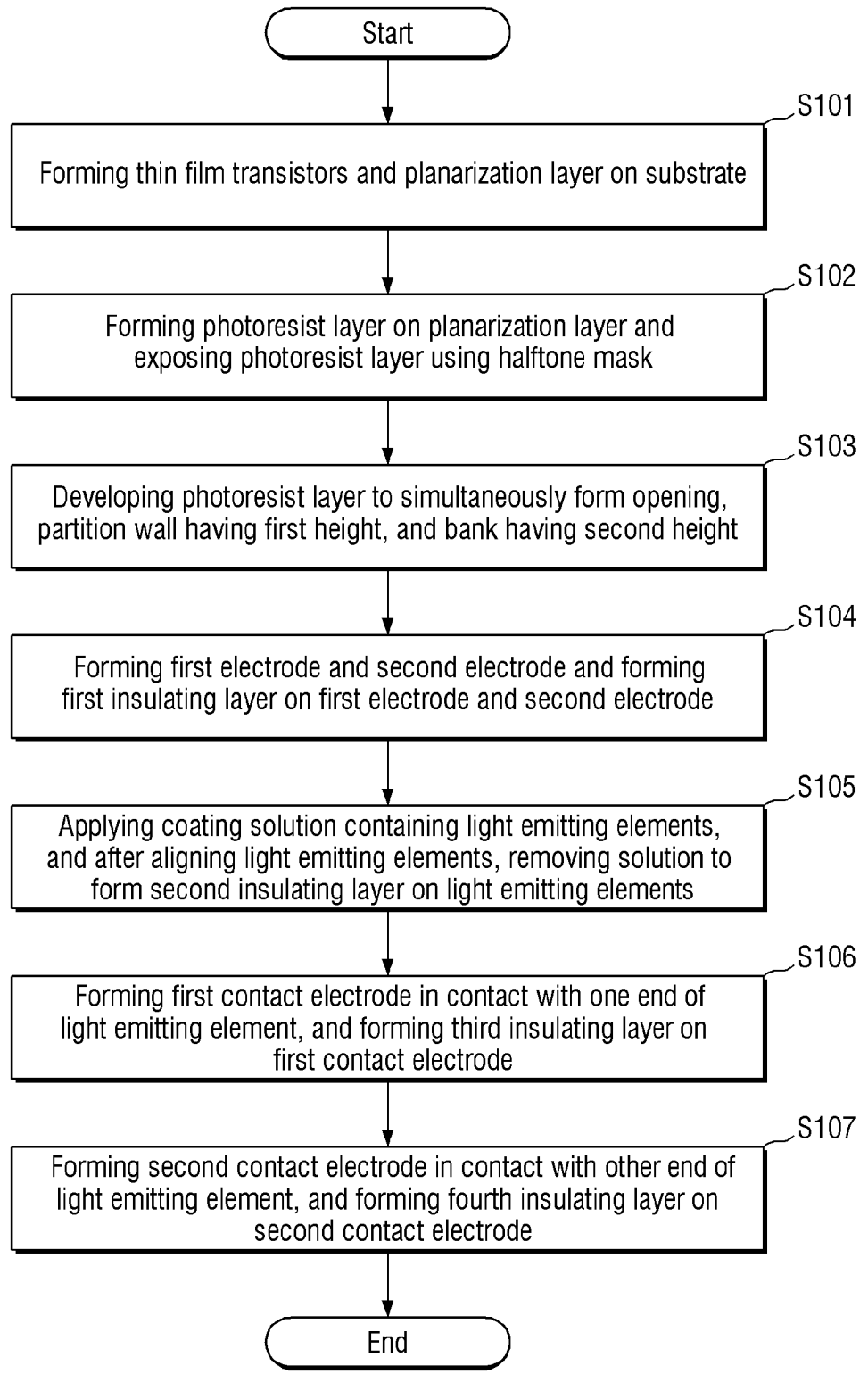
FIG. 20 is a flowchart illustrating a method for fabricating a display device according to an embodiment.

FIG. 20 is a flowchart illustrating a method for fabricating a display device according to an embodiment. FIGS. 21-27 are cross-sectional views illustrating a method for fabricating a display device according to an embodiment.

Hereinafter, a method for fabricating the display device 10 according to an embodiment will be described in detail with reference to FIGS. 20-27.

Figure 21:
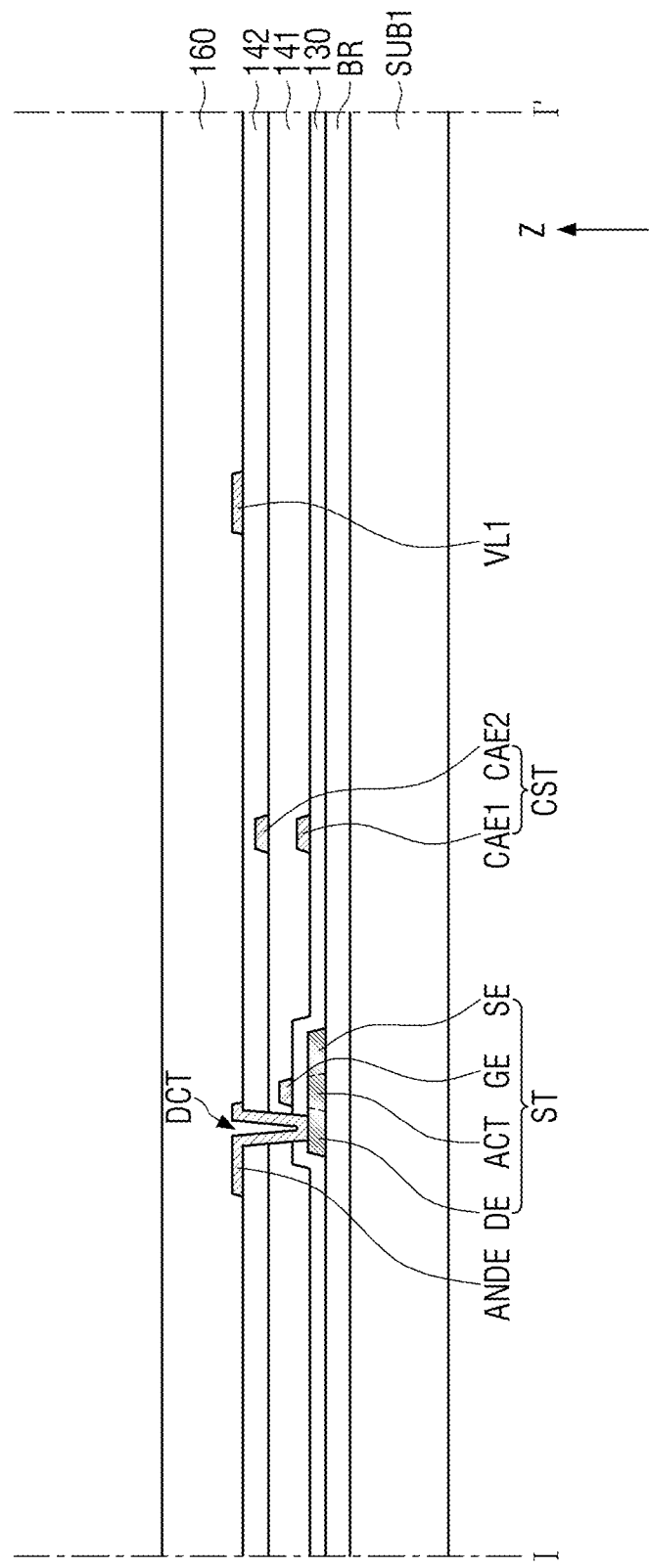
FIGS. 21-27 are cross-sectional views illustrating a method for fabricating a display device according to an embodiment.

First, as shown in FIG. 21, the thin film transistors ST and the planarization layer 160 are formed on the substrate SUB1 (S101 in FIG. 20).

An inorganic material is deposited on the substrate SUB1 to form the buffer layer BR.

Then, a semiconductor layer including the active layer ACT, the source electrode SE, and the drain electrode DE of the thin film transistor ST is formed on the buffer layer BR by a photolithography process. The semiconductor layer may be polycrystalline silicon, monocrystalline silicon, low-temperature polycrystalline silicon, amorphous silicon, or an oxide semiconductor.

Then, an inorganic material is deposited on the active layer ACT, the source electrode SE, and the drain electrode DE of the thin film transistor ST to form the gate insulating layer 130.

Then, a first gate conductive layer including the gate electrode GE of the thin film transistor ST and the first capacitor electrode CAE1 of the capacitor CST is formed on the gate insulating layer 130 by a photolithography process.

Then, the source electrode SE and the drain electrode DE are doped with ions or impurities while using the gate electrode GE of the thin film transistor ST as a mask. Accordingly, the source electrode SE and the drain electrode DE of the thin film transistor ST may have conductivity.

Then, an inorganic material is deposited on the gate electrode GE of the thin film transistor ST and the first capacitor electrode CAE1 to form the first interlayer insulating layer 141.

Then, a second gate conductive layer including the second capacitor electrode CAE2 of the capacitor CST is formed on the first interlayer insulating layer 141 by a photolithography process.

Then, an inorganic material is deposited on the second capacitor electrode CAE2 to form the second interlayer insulating layer 142.

Then, a drain contact hole DCT exposing the drain electrode DE of the thin film transistor ST while penetrating the gate insulating layer 130, the first interlayer insulating layer 141, and the second interlayer insulating layer 142 is formed by a photolithography process.

Then, a data conductive layer including the connection electrode ANDE and the first power supply line VL1 is formed on the second interlayer insulating layer 142 by a photolithography process. The connection electrode ANDE may be connected to the drain electrode DE of the thin film transistor ST through the drain contact hole DCT.

Then, an organic material is deposited on the connection electrode ANDE to form the planarization layer 160.

Figure 22:
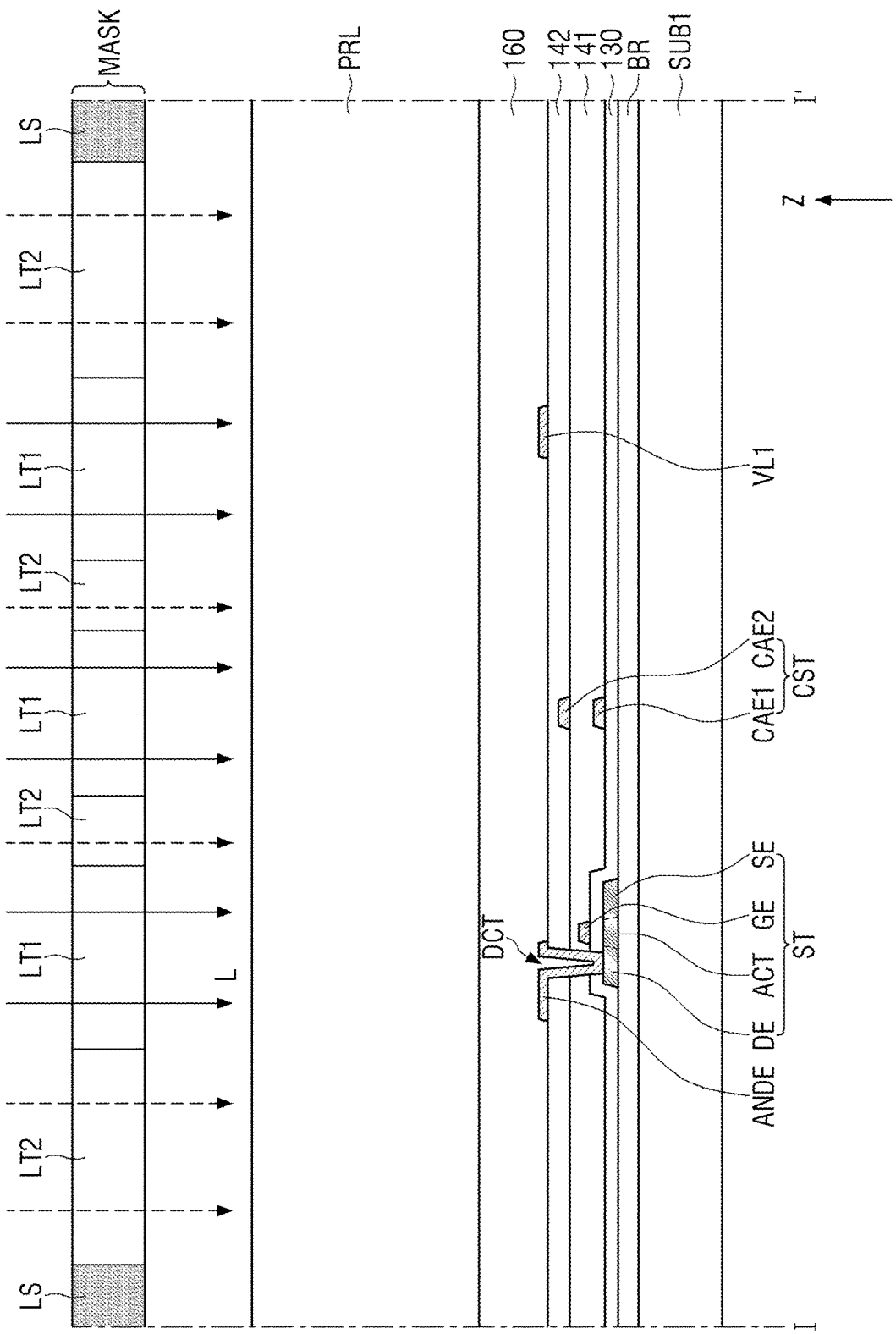

Next, as shown in FIG. 22, a photoresist layer PRL is formed on the planarization layer 160 and exposed using a halftone mask MASK (S102 in FIG. 20).

Figure 23:
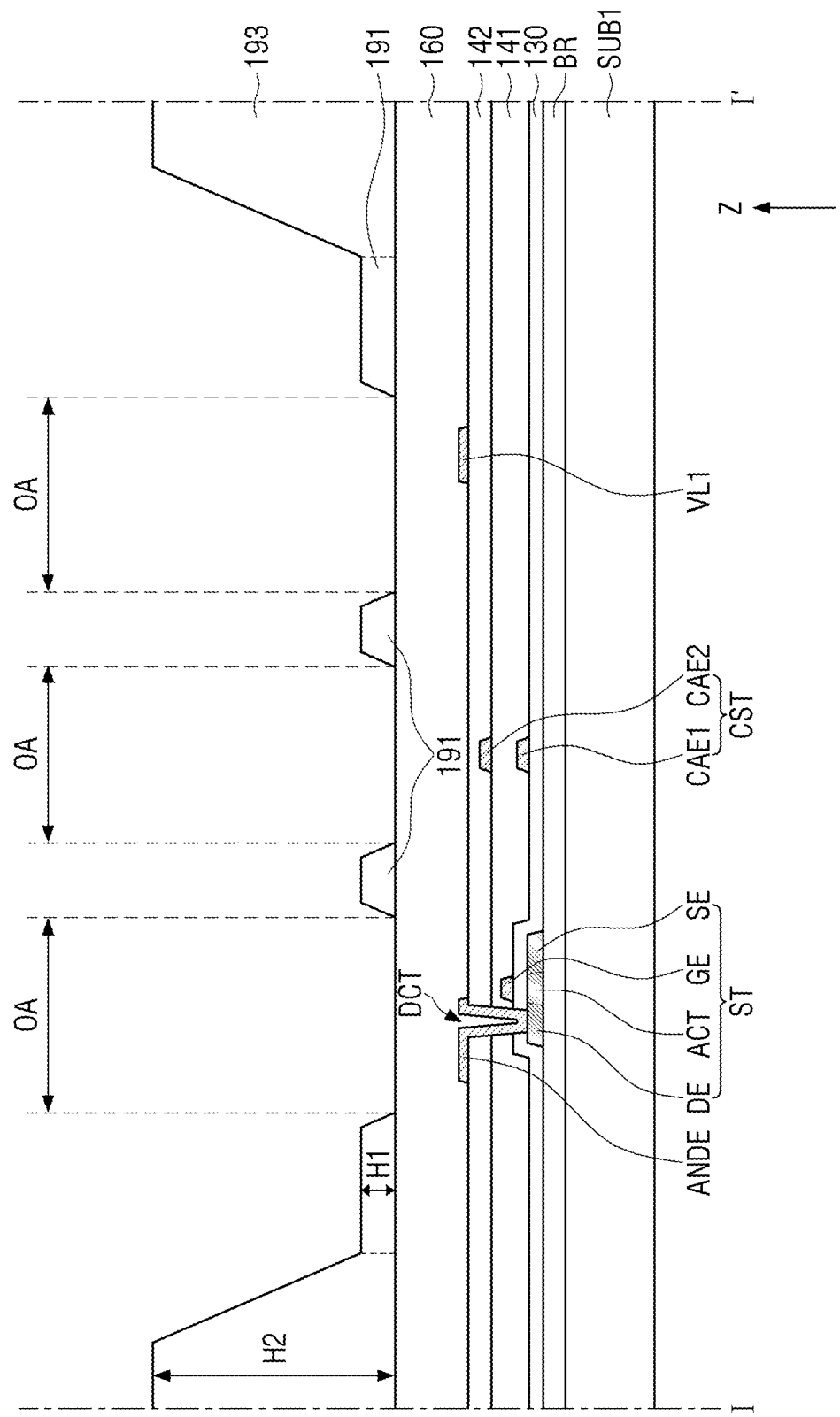

FIGS. 22 and 23 illustrate that the photoresist layer PRL is a positive photoresist that is removed when a portion to which light is irradiated is developed. However, the photoresist layer PRL may be a negative photoresist that is removed when a portion to which light is not irradiated is developed.

After the halftone mask MASK is disposed on the photoresist layer PRL, light is irradiated to the photoresist layer PRL. The halftone mask MASK includes a light blocking portion LS, a first light transmitting portion LT1, and a second light transmitting portion LT2. The light blocking portion LS may be an area that blocks light. The first light transmitting portion LT1 may be an area through which incident light is transmitted as it is. The second light transmitting portion LT2 may be an area through which only a part of the incident light is transmitted. The light transmittance of the second light transmitting portion LT2 may be about 50% or less.

Accordingly, the light may not be irradiated to the area of the photoresist layer PRL corresponding to the light blocking portion LS. Most of the incident light may be irradiated to the area of the photoresist layer PRL corresponding to the first light transmitting portion LT1. A part of the incident light may be irradiated to the area of the photoresist layer PRL corresponding to the second light transmitting portion LT2.

Next, as shown in FIG. 23, the photoresist layer PRL is developed to concurrently form (e.g., simultaneously form) the opening OA, the partition wall 191 having the first height H1, and the first bank 193 having the second height H2 (S103 in FIG. 20).

When the photoresist layer PRL is a positive photoresist, the area of the photoresist layers PRL corresponding to the first light transmitting portion LT1 is completely removed, so that the opening OA may be formed. A portion of the photoresist layer PRL corresponding to the second light transmitting portion LT2 is removed, so that the partition wall 191 having the first height H1 may be formed. The area of the photoresist layer PRL corresponding to the light blocking portion LS is not removed, so that the first bank 193 having the second height H2 greater than the first height H1 may be formed.

Figure 24:
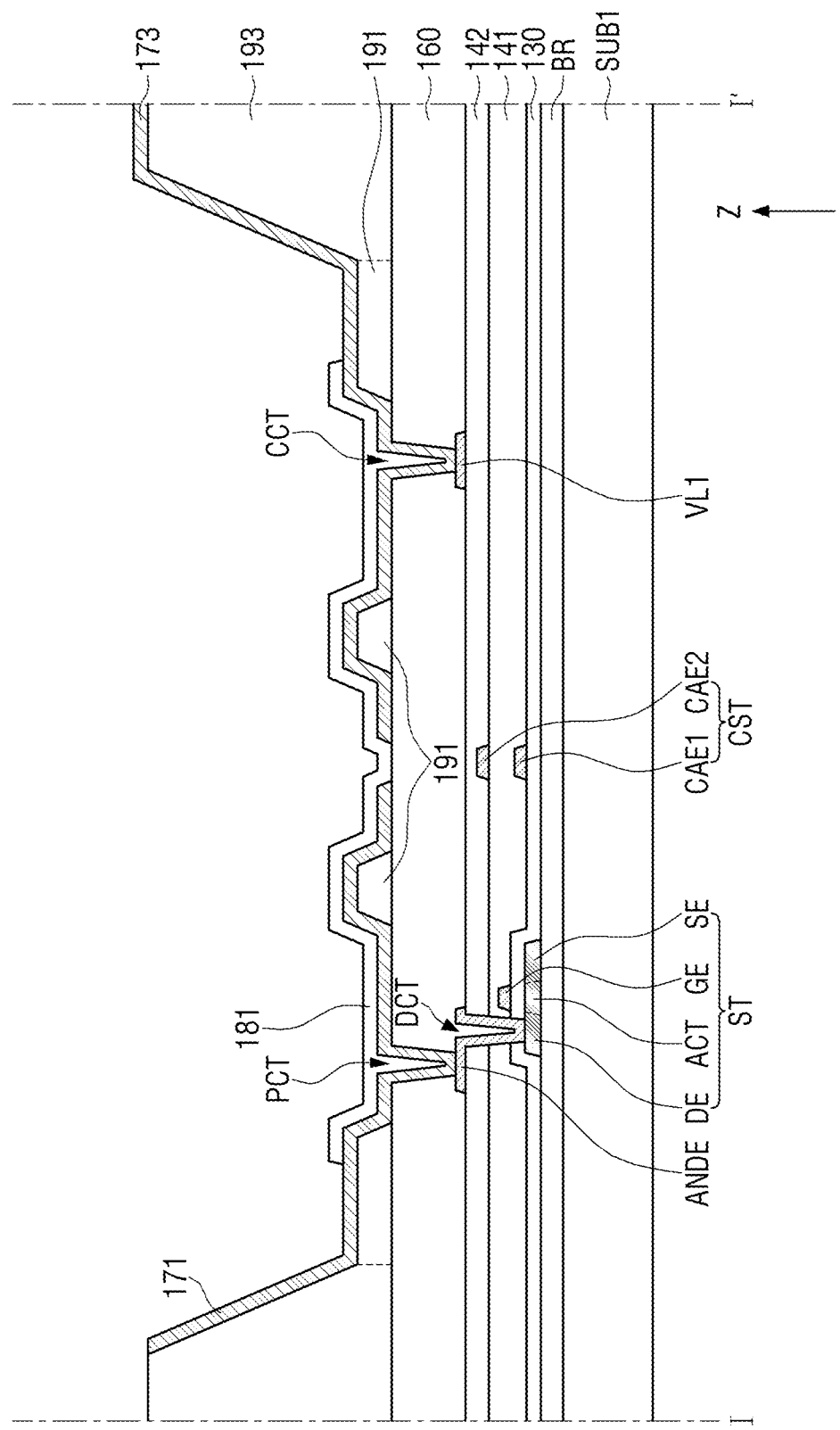

Next, as shown in FIG. 24, the first electrode 171 and the second electrode 173 are formed, and the first insulating layer 181 is formed on the first electrode 171 and the second electrode 173 (S104 in FIG. 20).

For example, the pixel contact hole PCT penetrating the planarization layer 160 to expose the connection electrode ANDE and the common contact hole CCT penetrating the planarization layer 160 to expose the first power supply line VL1 are concurrently formed (e.g., simultaneously formed) by a photolithography process.

Then, the first electrode 171 and the second electrode 173 are formed on the planarization layer 160 by a photolithography process. The first electrode 171 may be connected to the connection electrode ANDE through the pixel contact hole PCT. The second electrode 173 may be connected to the first power supply line VL1 through the common contact hole CCT.

Then, an inorganic material is deposited on the first electrode 171 and the second electrode 173 to form the first insulating layer 181.

Figure 25:
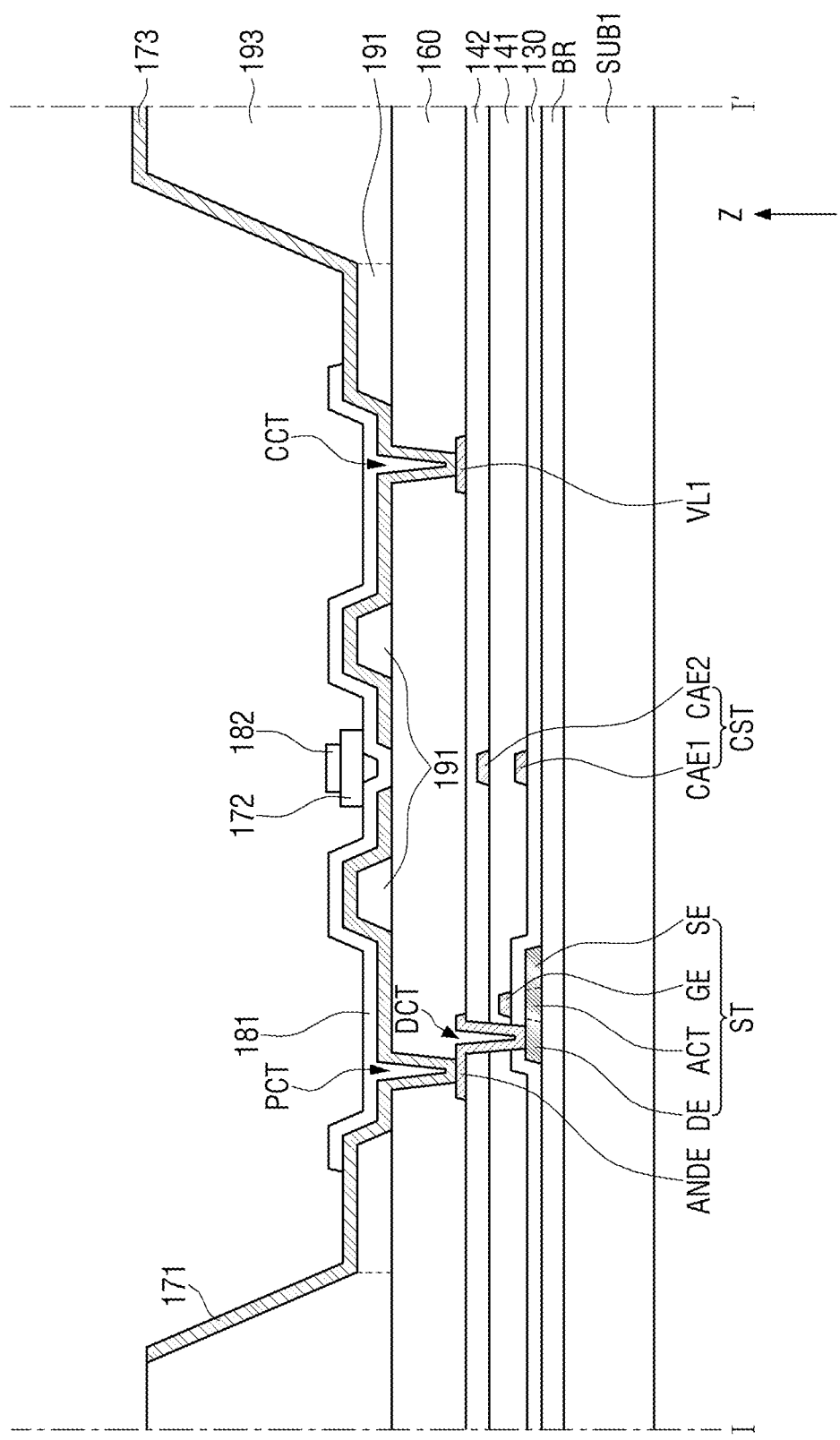

Next, as shown in FIG. 25, a coating solution containing light emitting elements 172 is applied, a voltage is applied to the first electrode 171 and the second electrode 173 to align the light emitting elements 172, and the coating solution is removed to form the second insulating layer 182 on the light emitting elements 172 (S105 in FIG. 20).

For example, the coating solution may be applied by any one of inkjet printing, inkjet injection, slot die coating, and slot die printing. The first bank 193 may be disposed in each of the sub-pixels PX1, PX2, and PX3 to surround the opening OA, and the coating solution may be disposed in the first bank 193 (e.g., the opening OA).

Then, a first driving voltage is applied to the first electrode 171 and a second driving voltage is applied to the second electrode 173 to form an electric field between the first electrode 171 and the second electrode 173. The light emitting elements 172 in the coating solution may be aligned by the electric field such that the first ends (e.g. one ends) of the light emitting elements 172 are disposed to be adjacent to the first electrode 171 and the second ends (e.g., the other ends) of the light emitting elements 172 are adjacent to the second electrode 173.

Then, the coating solution may be dried so that the coating solution except the light emitting element 172 is removed.

Then, an inorganic material is deposited on the light emitting elements 172 to form the second insulating layer 182.

Figure 26:
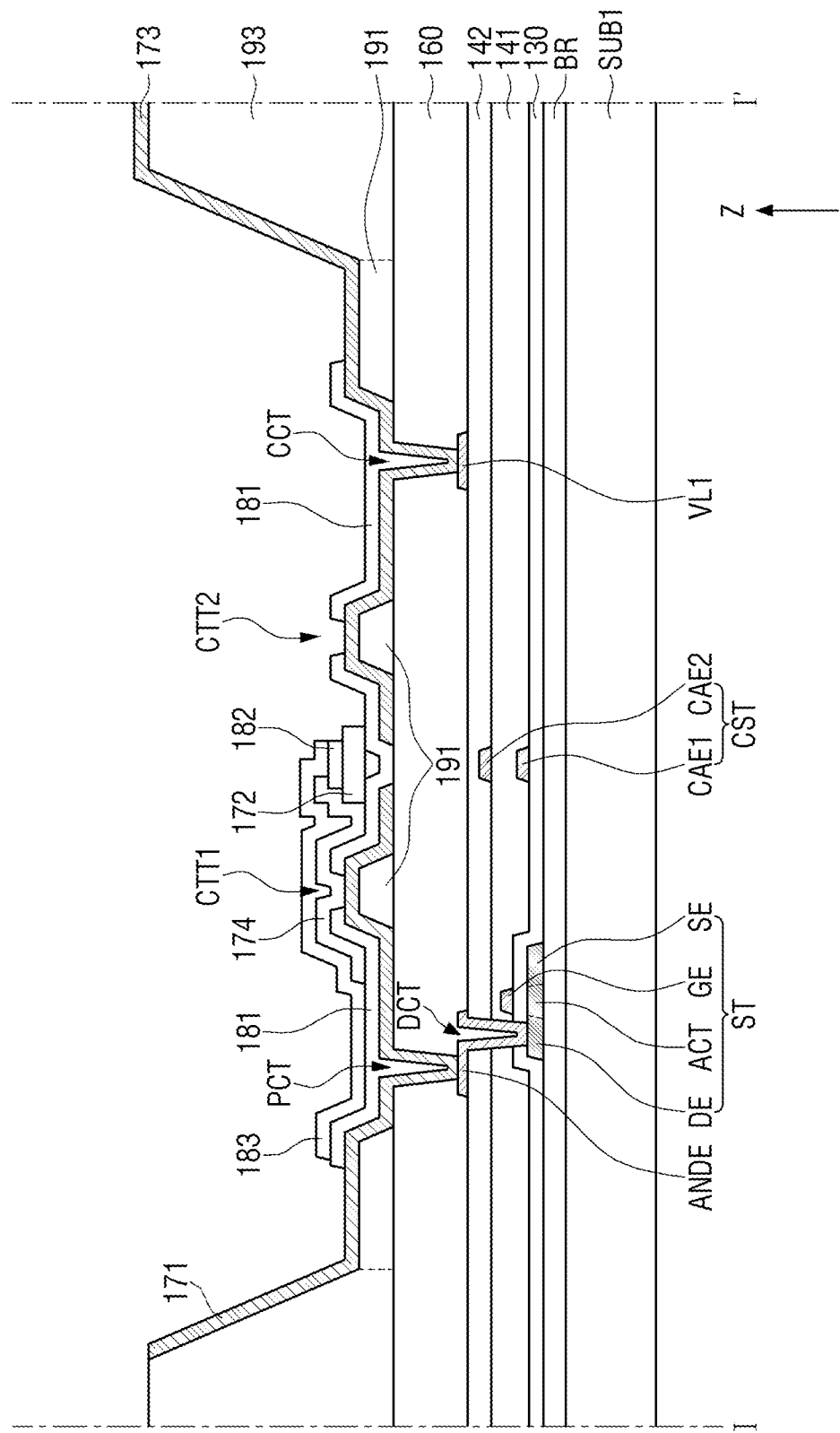

Next, as shown in FIG. 26, the first contact electrode 174 in contact with the first end of the light emitting element 172 is formed, and the third insulating layer 183 is formed on the first contact electrode 174 (S106 in FIG. 20).

For example, the first contact hole CTT1 penetrating the first insulating layer 181 to expose the first electrode 171 and the second contact hole CTT2 penetrating the first insulating layer 181 to expose the second electrode 173 are concurrently formed (e.g., simultaneously formed) by a photolithography process.

Then, the first contact electrode 174 is formed on the first insulating layer 181 by a photolithography process. The first contact electrode 174 may be connected to the first electrode 171 through the first contact hole CTT1.

Then, an inorganic material is deposited on the first contact electrode 174 to form the third insulating layer 183.

Figure 27:
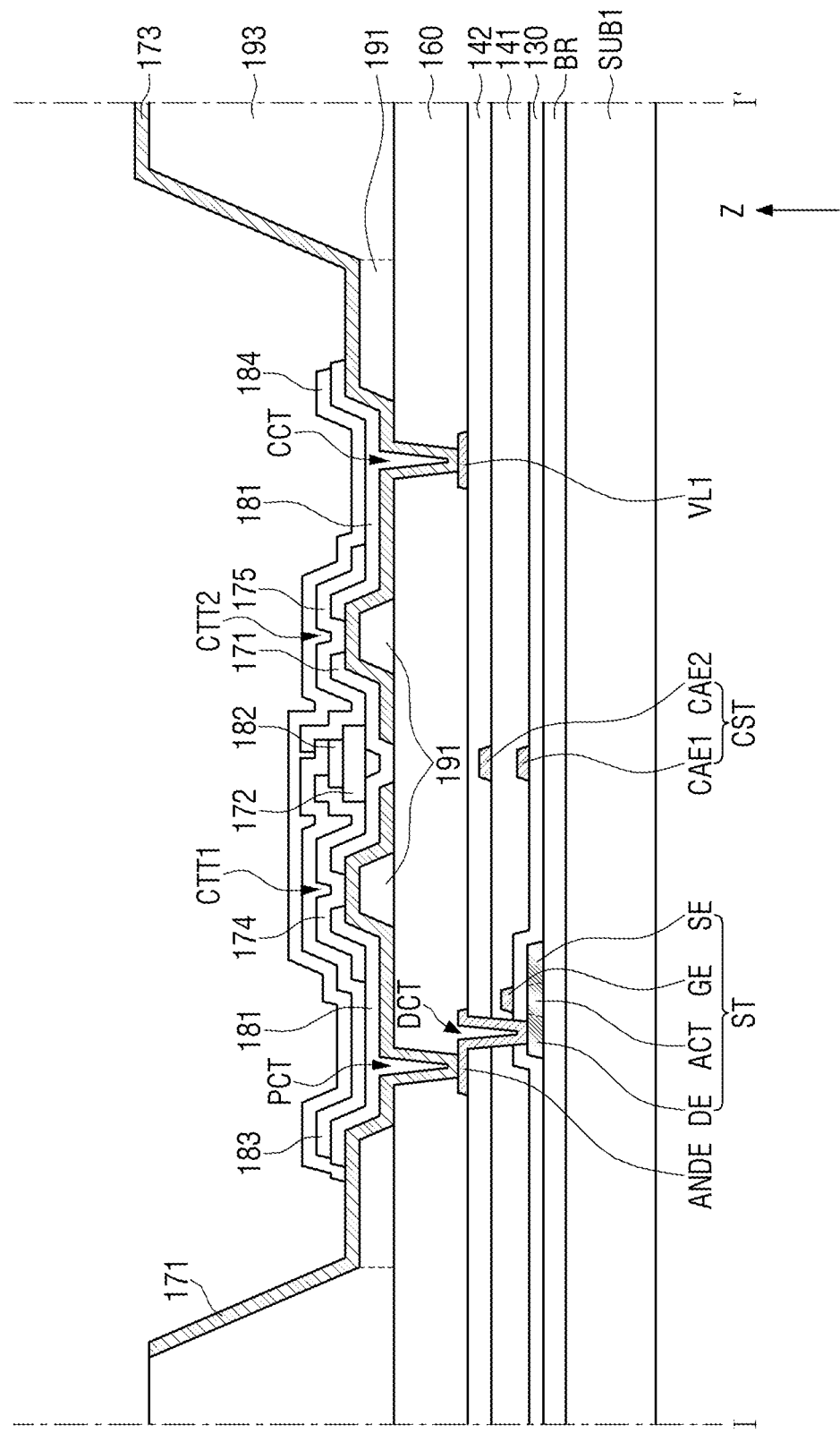

Next, as shown in FIG. 27, the second contact electrode 175 in contact with the second end of the light emitting element 172 is formed, and the fourth insulating layer 184 is formed on the second contact electrode 175 (S107 in FIG. 20).

For example, the second contact electrode 175 is formed on the first insulating layer 181 by a photolithography process. The second contact electrode 175 may be connected to the second electrode 173 through the second contact hole CTT2.

Then, an inorganic material is deposited on the second contact electrode 175 to form the fourth insulating layer 184.

As shown in FIGS. 20-27, the partition wall 191 defining the opening OA and the first bank 193 serving as a dam that traps the coating solution containing the light emitting elements 172 in the process for forming the light emitting elements 172 are integrally and concurrently formed (e.g., simultaneously formed) using the halftone mask MASK. Accordingly, the cost of the mask can be reduced and, further, the manufacturing cost can be reduced.

Although some embodiments of the present disclosure have been disclosed for illustrative purposes, those skilled in the art will appreciate that various modifications, additions and substitutions are possible, without departing from the scope and spirit of the disclosure as set forth by the accompanying claims and equivalents thereof.

What is claimed is:

1. A display device comprising:
a substrate;
a partition wall on the substrate and defining a first opening;
a first bank on the substrate and integrally formed with the partition wall, and defining a second opening;
a first electrode on the partition wall and the first bank;
a light emitting element located in the first opening and electrically connected to the first electrode;
an insulating layer on the light emitting element; and
a wavelength conversion layer on the insulating layer and configured to convert a wavelength of light emitted from the light emitting element,
wherein the wavelength conversion layer fills the first opening, and
wherein the first electrode disposed on a side surface of the first bank is directly in contact with the wavelength conversion layer.

2. The display device of claim 1, wherein the partition wall and the first bank comprise a same material.

3. The display device of claim 1, wherein a height of the partition wall is lower than a height of the first bank.

4. The display device of claim 1, wherein the first electrode is on a side surface of the first bank.

5. The display device of claim 1, wherein at least a portion of a side surface of the first bank is not covered by the first electrode.

6. The display device of claim 1, wherein the first electrode is on a top surface of the first bank.

7. The display device of claim 1, further comprising a second electrode on the partition wall,
wherein the light emitting element is electrically connected to the second electrode.

8. The display device of claim 7, wherein the second electrode is on the first bank.

9. The display device of claim 7, wherein the second electrode is on a side surface and a top surface of the first bank.

10. The display device of claim 1, further comprising:
the insulating layer on the light emitting element; and
the wavelength conversion layer on the insulating layer and configured to convert a wavelength of light emitted from the light emitting element.

11. The display device of claim 10, wherein the wavelength conversion layer is in contact with the first electrode on a side surface of the first bank.

12. The display device of claim 10, further comprising a second bank on a top surface of the first bank.

13. The display device of claim 12, wherein a height of the first bank is higher than a height of the second bank.

14. The display device of claim 12, wherein the wavelength conversion layer is in contact with a side surface of the second bank.

15. A display device comprising:
a substrate;
a bank on the substrate;
a first electrode on a second opening of the bank and the bank;
a second electrode on the second opening and the bank;
a light emitting element located in the second opening and electrically connected to the first electrode and the second electrode;
an insulating layer on the light emitting element; and
a wavelength conversion layer on the insulating layer and configured to convert a wavelength of light emitted from the light emitting element,
wherein the bank comprises a first sub-bank having a first height and a second sub-bank having a second height higher than the first height,
wherein the first sub-bank and the second sub-bank are integrally formed,
wherein the second sub-bank defines a first opening, and the first sub-bank defines the second opening,
wherein the wavelength conversion layer fills the first opening, and
wherein the first electrode disposed on a side surface of the second sub-bank is directly in contact with the wavelength conversion layer.

16. The display device of claim 15, wherein the first electrode is on a side surface and a top surface of the first sub-bank, and a side surface of the second sub-bank.

17. The display device of claim 15, wherein the second electrode is on a side surface and a top surface of the first sub-bank, and a side surface and a top surface of the second sub-bank.

* * * * *